(12) United States Patent  
Poivet

(10) Patent No.: US 11,283,393 B2  
(45) Date of Patent: Mar. 22, 2022

(54) MOVABLE BUILDING CROWN

(71) Applicant: KBFX LLC, Lewes, DE (US)

(72) Inventor: Alain Poivet, Palo Alto, CA (US)

(73) Assignee: KBFX LLC, Lewes, DE (US)

( * ) Notice: Subject to any disclaimer, the term of this patent is extended or adjusted under 35 U.S.C. 154(b) by 0 days.

(21) Appl. No.: 16/237,517

(22) Filed: Dec. 31, 2018

(65) Prior Publication Data

US 2019/0140580 A1 May 9, 2019

Related U.S. Application Data

(63) Continuation of application No. 14/970,431, filed on Dec. 15, 2015, now Pat. No. 10,277,159, which is a  
(Continued)

(30) Foreign Application Priority Data

Nov. 17, 2008 (FR) ..................................... 0806419

(51) Int. Cl.  
*H02S 20/23* (2014.01)  
*E04D 3/40* (2006.01)  
(Continued)

(52) U.S. Cl.  
CPC ................ *H02S 20/23* (2014.12); *E04D 3/40* (2013.01); *E04F 13/072* (2013.01); *F24S 20/66* (2018.05);  
(Continued)

(58) Field of Classification Search  
CPC ... E04D 3/40; F24S 20/66; F24S 20/67; F24S 25/12; F24S 25/13; F24S 25/35;  
(Continued)

(56) References Cited

U.S. PATENT DOCUMENTS

| | | |
|---|---|---|
| 3,800,358 A | 4/1974 | Ryan |
| 3,895,604 A | 7/1975 | Ryan |
| | (Continued) | |

FOREIGN PATENT DOCUMENTS

| | | |
|---|---|---|
| DE | 20219173 | 2/2004 |
| DE | 202005007855 | 8/2005 |
| | (Continued) | |

OTHER PUBLICATIONS

U.S. Appl. No. 15/155,015, Poivet.

(Continued)

*Primary Examiner* — James M Ference  
(74) *Attorney, Agent, or Firm* — Sheppard, Mullin, Richter & Hampton LLP

(57) ABSTRACT

A solar panel system comprises a base, the base attached to a building at a geographic location; a rotating crown having a rotating mechanism, the base supporting the crown; a solar panel device attached to the crown, the solar panel device having an exposed surface, the shapes of the base, crown and solar panel device positioning the exposed surface in a sloped orientation relative to a horizontal plane at the geographic location, the rotating mechanism rotating the solar panel device, the base and crown shapes positioning the rotating mechanism to rotate about an axis perpendicular to the horizontal plane and to maintain a consistent slope relative to the horizontal plane as the exposed surface rotates; and a control system controlling rotation from a first azimuthal direction to a second azimuthal direction that faces the exposed surface towards the Sun more normally than the first azimuthal direction.

10 Claims, 29 Drawing Sheets

Related U.S. Application Data continuation-in-part of application No. 14/217,288, filed on Mar. 17, 2014, now abandoned, and a continuation-in-part of application No. 14/217,427, filed on Mar. 17, 2014, now abandoned, and a continuation-in-part of application No. 13/831,496, filed on Mar. 14, 2013, now abandoned, and a continuation-in-part of application No. 13/760,965, filed on Feb. 6, 2013, now abandoned, which is a continuation of application No. 13/129,378, filed on May 13, 2011, now Pat. No. 8,794,583, said application No. 13/831,496 is a continuation-in-part of application No. 13/129,378, filed as application No. PCT/FR2009/001322 on Nov. 17, 2009, now Pat. No. 8,794,583.

(60) Provisional application No. 62/092,793, filed on Dec. 16, 2014, provisional application No. 61/789,607, filed on Mar. 15, 2013, provisional application No. 61/801,089, filed on Mar. 15, 2013.

(51) Int. Cl.
| | | |
|---|---|---|
| *E04F 13/072* | (2006.01) | |
| *H01L 31/052* | (2014.01) | |
| *H02S 20/26* | (2014.01) | |
| *H02S 20/22* | (2014.01) | |
| *F24S 20/67* | (2018.01) | |
| *F24S 25/35* | (2018.01) | |
| *F24S 25/13* | (2018.01) | |
| *F24S 25/12* | (2018.01) | |
| *F24S 25/636* | (2018.01) | |
| *F24S 40/20* | (2018.01) | |
| *F24S 20/66* | (2018.01) | |
| *F24S 40/44* | (2018.01) | |
| *H02S 40/44* | (2014.01) | |
| *F24S 25/00* | (2018.01) | |

(52) U.S. Cl.
CPC ............ *F24S 20/67* (2018.05); *F24S 25/12* (2018.05); *F24S 25/13* (2018.05); *F24S 25/35* (2018.05); *F24S 25/636* (2018.05); *F24S 40/20* (2018.05); *F24S 40/44* (2018.05); *H01L 31/0521* (2013.01); *H02S 20/22* (2014.12); *H02S 20/26* (2014.12); *H02S 40/44* (2014.12); *F24S 2025/013* (2018.05); *F24S 2025/021* (2018.05); *F24S 2025/801* (2018.05); *F24S 2025/804* (2018.05); *F24S 2025/807* (2018.05); *F24S 2201/00* (2018.05); *Y02B 10/10* (2013.01); *Y02B 10/20* (2013.01); *Y02E 10/44* (2013.01); *Y02E 10/47* (2013.01); *Y02E 10/50* (2013.01)

(58) Field of Classification Search
CPC .......... F24S 25/636; F24S 40/20; F24S 40/44; F24S 2025/013; F24S 2025/021; F24S 2025/801; F24S 2025/804; F24S 2025/807; F24S 2201/00; H01L 31/0521; H02S 20/22; H02S 20/23; H02S 20/26; H02S 40/44; Y02B 10/12; Y02B 10/20; Y02B 10/44; Y02B 10/47; Y02B 10/50; Y02B 10/60; Y02B 10/10
See application file for complete search history.

(56) References Cited

U.S. PATENT DOCUMENTS

| | | |
|---|---|---|
| 4,000,850 A | 1/1977 | Diggs |
| 4,010,733 A | 3/1977 | Moore |
| 4,014,133 A | 3/1977 | Brown |
| 4,029,080 A | 6/1977 | Warren |
| 4,033,327 A | 7/1977 | Pei |
| 4,073,283 A | 2/1978 | Lof |
| 4,096,861 A | 6/1978 | Bowles |
| 4,098,260 A | 7/1978 | Goettl |
| 4,114,594 A * | 9/1978 | Meyer ............... F24S 30/425 126/606 |
| 4,119,084 A | 10/1978 | Eckels |
| 4,136,669 A | 1/1979 | Lane |
| 4,150,660 A | 4/1979 | Peters |
| 4,171,694 A | 10/1979 | Parker |
| 4,174,703 A | 11/1979 | Blakey |
| 4,175,542 A | 11/1979 | Duchene |
| 4,178,910 A | 12/1979 | Gramer |
| 4,184,476 A | 1/1980 | McArthur |
| 4,184,479 A | 1/1980 | Ratliff, Jr. |
| 4,212,291 A | 7/1980 | Erb |
| 4,215,677 A | 8/1980 | Erickson |
| 4,223,667 A | 9/1980 | Paymal |
| 4,233,958 A | 11/1980 | Heden |
| 4,239,555 A | 12/1980 | Scharlack |
| 4,274,395 A | 6/1981 | Bangs |
| 4,280,484 A | 7/1981 | Mancosu |
| 4,324,232 A | 4/1982 | Quiroz |
| 4,332,239 A * | 6/1982 | Hotine ............... G01S 3/7861 126/576 |
| 4,334,521 A * | 6/1982 | Jacoby ............... G01S 3/7861 126/574 |
| 4,375,637 A | 3/1983 | Desjardins |
| 4,393,859 A | 7/1983 | Marossy |
| 4,426,999 A | 1/1984 | Evans |
| 4,526,161 A | 7/1985 | Kaicher |
| 4,594,470 A | 6/1986 | Headrick |
| 4,677,248 A | 6/1987 | Lacey |
| 4,718,404 A | 1/1988 | Sadler |
| 4,724,645 A | 2/1988 | Pigout |
| 4,751,800 A | 6/1988 | Kida |
| 4,788,746 A | 12/1988 | Idler |
| 4,883,340 A | 11/1989 | Dominguez |
| 4,917,004 A | 4/1990 | Okamoto |
| 4,928,444 A | 5/1990 | Horie |
| 4,936,096 A | 6/1990 | Vanderjagt |
| 4,942,698 A | 7/1990 | Kumagai |
| 5,038,517 A | 8/1991 | Talbott |
| 5,092,939 A | 3/1992 | Nath |
| 5,109,566 A | 5/1992 | Kobayashi |
| 5,134,827 A | 8/1992 | Hartman |
| 5,164,020 A | 11/1992 | Wagner |
| 5,180,442 A | 1/1993 | Elias |
| 5,189,851 A | 3/1993 | Omika |
| 5,261,184 A | 11/1993 | Appeldorn |
| 5,367,843 A | 11/1994 | Hirai |
| 5,528,789 A | 6/1996 | Rostamo |
| 5,571,338 A | 11/1996 | Kadonome |
| 5,576,947 A | 11/1996 | Wienkop |
| 5,622,078 A * | 4/1997 | Mattson ............... F16H 25/186 74/89.23 |
| 5,787,653 A | 8/1998 | Sakai |
| 5,802,762 A | 9/1998 | Stonecypher |
| 5,813,169 A | 9/1998 | Engerman |
| 5,968,287 A | 10/1999 | Nath |
| 6,005,236 A | 12/1999 | Phelan et al. |
| 6,065,252 A | 5/2000 | Norsen |
| 6,065,255 A | 5/2000 | Stern |
| 6,105,317 A | 8/2000 | Tomiuchi |
| 6,108,597 A | 8/2000 | Kirchner |
| 6,111,189 A | 8/2000 | Garvison |
| 6,354,289 B1 | 3/2002 | Ridett |
| 6,559,371 B2 | 5/2003 | Shingleton |
| 6,563,040 B2 | 5/2003 | Hayden |
| 6,590,363 B2 * | 7/2003 | Teramoto ............... F03G 6/001 320/101 |
| 6,617,507 B2 | 9/2003 | Mapes |
| 6,672,018 B2 | 1/2004 | Shingleton |
| 6,691,701 B1 * | 2/2004 | Roth ............... F24S 23/79 126/685 |
| 6,799,398 B1 | 10/2004 | Plevyak |
| 7,260,918 B2 | 8/2007 | Liebendorfer |

(56) References Cited

U.S. PATENT DOCUMENTS

| | | | |
|---|---|---|---|
| 7,299,591 B2 | 11/2007 | Broatch | |
| 7,454,990 B2 | 11/2008 | Hardcastle, III | |
| 7,531,741 B1 | 5/2009 | Melton | |
| 7,592,537 B1 | 9/2009 | West | |
| 7,600,349 B2 | 10/2009 | Liebendorfer | |
| 7,661,391 B2 | 2/2010 | Sia | |
| 7,703,246 B2 | 4/2010 | Chang | |
| 7,745,723 B2 | 6/2010 | Dyson | |
| 7,748,175 B2 | 7/2010 | Liebendorfer | |
| 7,774,998 B2 | 8/2010 | Aschenbrenner | |
| 7,923,624 B2* | 4/2011 | Borton | F24S 30/458 136/246 |
| 7,956,280 B2 | 6/2011 | Kobayashi | |
| 8,039,733 B2 | 10/2011 | Kobayashi | |
| 8,136,783 B2 | 3/2012 | Pietrzak | |
| 8,181,402 B2 | 5/2012 | Tsuzuki | |
| 8,324,496 B1* | 12/2012 | Gross | F24S 40/85 136/246 |
| 8,336,261 B2 | 12/2012 | Hosking | |
| 8,338,771 B2 | 12/2012 | Park | |
| 8,344,239 B2 | 1/2013 | Plaisted | |
| 8,347,556 B2 | 1/2013 | Stelmaszek | |
| 8,426,792 B2 | 4/2013 | Olsson | |
| 8,459,249 B2 | 6/2013 | Corio | |
| 8,646,230 B2* | 2/2014 | Powers, III | E04B 1/3416 52/262 |
| 8,794,583 B2 | 8/2014 | Poivet | |
| 8,939,143 B2* | 1/2015 | Zuritis | F24S 25/60 126/569 |
| 8,972,069 B1* | 3/2015 | Hudson | H02J 3/381 700/287 |
| 8,991,117 B1 | 3/2015 | Walker et al. | |
| 9,275,391 B2* | 3/2016 | Thramann | G06Q 10/083 |
| 9,466,749 B1* | 10/2016 | Au | F24S 25/65 |
| 9,581,678 B2 | 2/2017 | Corio | |
| 10,042,030 B2 | 8/2018 | Corio | |
| 2002/0179138 A1 | 12/2002 | Lawheed | |
| 2003/0015636 A1 | 1/2003 | Liebendorfer | |
| 2003/0201009 A1 | 10/2003 | Nakajima | |
| 2004/0011354 A1 | 1/2004 | Erling | |
| 2004/0124711 A1 | 7/2004 | Muchow | |
| 2004/0144043 A1 | 7/2004 | Stevenson | |
| 2004/0187907 A1* | 9/2004 | Morgal | H01L 31/0521 136/246 |
| 2004/0221886 A1 | 11/2004 | Oono | |
| 2004/0231089 A1 | 11/2004 | Vilarasau Alegre | |
| 2005/0050811 A1 | 3/2005 | Yen | |
| 2005/0092218 A1* | 5/2005 | Saucier | E04H 9/12 109/1 S |
| 2005/0115603 A1 | 6/2005 | Yoshida | |
| 2005/0144903 A1 | 7/2005 | Ceria | |
| 2005/0166955 A1 | 8/2005 | Nath | |
| 2005/0171644 A1 | 8/2005 | Tani | |
| 2006/0086382 A1 | 4/2006 | Plaisted | |
| 2006/0118163 A1 | 6/2006 | Plaisted | |
| 2006/0277845 A1 | 12/2006 | Warfield | |
| 2007/0023080 A1 | 2/2007 | Thurner et al. | |
| 2007/0035841 A1 | 2/2007 | Kinney | |
| 2007/0079861 A1 | 4/2007 | Morali | |
| 2007/0132433 A1* | 6/2007 | Hehmann | G09F 13/00 323/214 |
| 2007/0199590 A1 | 8/2007 | Tanaka | |
| 2007/0219645 A1 | 9/2007 | Thomas | |
| 2007/0289227 A1 | 12/2007 | Parker | |
| 2008/0012310 A1 | 1/2008 | Weaver | |
| 2008/0029148 A1 | 2/2008 | Thompson | |
| 2008/0035196 A1 | 2/2008 | Monus | |
| 2008/0053008 A1 | 3/2008 | Ohkoshi | |
| 2008/0053517 A1 | 3/2008 | Plaisted | |
| 2008/0087275 A1 | 4/2008 | Sade | |
| 2008/0139106 A1 | 6/2008 | Vachon | |
| 2008/0176504 A1 | 7/2008 | McClendon | |
| 2008/0218307 A1 | 9/2008 | Schoettle | |
| 2008/0236571 A1 | 10/2008 | Keshner | |
| 2008/0245399 A1 | 10/2008 | DeLiddo | |
| 2008/0245404 A1 | 10/2008 | DeLiddo | |
| 2008/0302407 A1 | 12/2008 | Kobayashi | |
| 2008/0308091 A1* | 12/2008 | Corio | F24S 30/425 126/606 |
| 2008/0313976 A1 | 12/2008 | Allen | |
| 2009/0032089 A1 | 2/2009 | Chen et al. | |
| 2009/0045936 A1 | 2/2009 | Miller | |
| 2009/0050194 A1* | 2/2009 | Noble | F24S 25/12 136/251 |
| 2009/0056698 A1* | 3/2009 | Johnson | H01L 31/052 126/569 |
| 2009/0095283 A1 | 4/2009 | Curtis et al. | |
| 2009/0165843 A1 | 7/2009 | Horioka | |
| 2009/0188487 A1* | 7/2009 | Jones | F24S 25/10 126/600 |
| 2009/0223142 A1 | 9/2009 | Shingleton | |
| 2009/0241994 A1 | 10/2009 | Lee | |
| 2009/0250095 A1* | 10/2009 | Thorley | G02B 3/08 136/246 |
| 2009/0266353 A1 | 10/2009 | Lee | |
| 2009/0277496 A1* | 11/2009 | Khazeni | F24S 40/20 136/246 |
| 2010/0000165 A1* | 1/2010 | Koller | A01G 9/243 52/173.3 |
| 2010/0000570 A1 | 1/2010 | Mertins | |
| 2010/0000596 A1* | 1/2010 | Mackler | H02S 40/32 136/246 |
| 2010/0006088 A1* | 1/2010 | Campbell | F24S 50/20 126/573 |
| 2010/0018570 A1* | 1/2010 | Cashion | H01L 31/0547 136/246 |
| 2010/0024861 A1* | 2/2010 | Cabanillas Saldana | F24S 30/452 136/244 |
| 2010/0132769 A1* | 6/2010 | Potter | F24S 25/634 136/251 |
| 2010/0139645 A1 | 6/2010 | Whipple et al. | |
| 2010/0155547 A1 | 6/2010 | Kobayashi | |
| 2010/0175685 A1* | 7/2010 | Campbell | F24S 50/20 126/601 |
| 2010/0175741 A1* | 7/2010 | Thorne | H02S 20/32 136/251 |
| 2010/0193013 A1* | 8/2010 | Kong | F24S 30/458 136/251 |
| 2010/0206294 A1 | 8/2010 | Blair | |
| 2010/0206302 A1* | 8/2010 | Cheung | H02S 20/32 126/694 |
| 2010/0206379 A1* | 8/2010 | Littau | F24S 23/82 136/259 |
| 2010/0212654 A1 | 8/2010 | Alejo Trevijano | |
| 2010/0223864 A1 | 9/2010 | Dube | |
| 2010/0235206 A1 | 9/2010 | Miller | |
| 2010/0258110 A1* | 10/2010 | Krabbe | F24S 25/50 126/605 |
| 2010/0282315 A1* | 11/2010 | Gilbert | F24S 20/20 136/259 |
| 2011/0000515 A1* | 1/2011 | Patwardhan | H02S 20/32 136/206 |
| 2011/0005128 A1* | 1/2011 | Chuang | A01G 9/243 47/17 |
| 2011/0023938 A1 | 2/2011 | Buchel et al. | |
| 2011/0023940 A1 | 2/2011 | Do et al. | |
| 2011/0030672 A1* | 2/2011 | Olsson | E04D 13/033 126/574 |
| 2011/0073161 A1* | 3/2011 | Scanlon | F24S 25/636 136/246 |
| 2011/0094503 A1* | 4/2011 | Jones | F24S 30/425 126/714 |
| 2011/0094559 A1* | 4/2011 | Potter | F24S 25/63 136/244 |
| 2011/0126378 A1 | 6/2011 | Ota | |
| 2011/0126884 A1* | 6/2011 | Dritsas | H02S 20/00 136/246 |
| 2011/0137458 A1 | 6/2011 | Histani | |
| 2011/0167735 A1 | 7/2011 | Sumner | |
| 2011/0209745 A1 | 9/2011 | Korman | |

(56) References Cited

U.S. PATENT DOCUMENTS

| | | | |
|---|---|---|---|
| 2011/0215213 A1 | 9/2011 | Poivet | |
| 2011/0240007 A1* | 10/2011 | Currier | F24S 30/452 126/606 |
| 2011/0273304 A1* | 11/2011 | Pryor | H04Q 9/00 340/870.01 |
| 2011/0284057 A1 | 11/2011 | Swahn | |
| 2011/0290306 A1* | 12/2011 | Roberts | H02S 20/32 136/251 |
| 2012/0027550 A1 | 2/2012 | Bellacicco | |
| 2012/0117890 A1 | 5/2012 | Adell Argiles | |
| 2012/0125399 A1 | 5/2012 | Schatz et al. | |
| 2012/0125401 A1* | 5/2012 | DeVillier | F24S 50/20 136/246 |
| 2012/0132262 A1 | 5/2012 | Sagayama | |
| 2012/0152877 A1 | 6/2012 | Tadayon | |
| 2012/0199266 A1 | 8/2012 | Potter | |
| 2012/0216851 A1* | 8/2012 | Jang | F24S 25/70 136/246 |
| 2012/0216852 A1 | 8/2012 | Almy et al. | |
| 2012/0223033 A1 | 9/2012 | Molek | |
| 2012/0255540 A1* | 10/2012 | Hutchin | G02B 5/04 126/600 |
| 2012/0260968 A1* | 10/2012 | Enrile Medina | F24S 30/452 136/246 |
| 2012/0297704 A1 | 11/2012 | Glynn | |
| 2013/0056614 A1* | 3/2013 | Balachandreswaran | G01J 1/0219 250/203.4 |
| 2013/0118099 A1 | 5/2013 | Scanlon | |
| 2013/0139468 A1 | 6/2013 | Poivet | |
| 2013/0178951 A1 | 7/2013 | Sandler | |
| 2013/0319508 A1 | 12/2013 | Sinclair et al. | |
| 2014/0041321 A1 | 2/2014 | Poivet | |
| 2014/0137924 A1* | 5/2014 | Hollabaugh | F24S 30/452 136/246 |
| 2014/0166069 A1* | 6/2014 | Kirchner | H02S 20/32 136/246 |
| 2014/0172176 A1 | 6/2014 | Deilman | |
| 2014/0196387 A1 | 7/2014 | Neito et al. | |
| 2014/0196764 A1* | 7/2014 | Clavelle | H02S 20/10 136/248 |
| 2014/0216522 A1* | 8/2014 | Au | F24S 25/70 136/246 |
| 2014/0259899 A1* | 9/2014 | Poivet | F24S 30/428 47/17 |
| 2014/0288714 A1* | 9/2014 | Poivet | G05B 15/02 700/275 |
| 2014/0338659 A1* | 11/2014 | Corio | F24S 30/428 126/714 |
| 2015/0000721 A1* | 1/2015 | Au | H02S 20/10 136/246 |
| 2015/0000722 A1* | 1/2015 | Au | F24S 25/65 136/246 |
| 2015/0001356 A1* | 1/2015 | Au | F16M 13/022 248/185.1 |
| 2015/0054413 A1* | 2/2015 | Chen | H05B 47/11 315/155 |
| 2015/0056614 A1* | 2/2015 | Mikolajczyk | G01N 33/54306 435/6.11 |
| 2015/0108314 A1* | 4/2015 | Ceron Garcia | F24S 30/422 248/425 |
| 2015/0226826 A1* | 8/2015 | Quero Reboul | F24S 30/452 250/203.4 |
| 2015/0234031 A1 | 8/2015 | Corio | |
| 2015/0244316 A1 | 8/2015 | Singer et al. | |
| 2015/0256124 A1 | 9/2015 | Singer et al. | |
| 2015/0316639 A1 | 11/2015 | Russ et al. | |
| 2015/0331972 A1* | 11/2015 | McClure | G06F 17/11 703/2 |
| 2015/0357966 A1 | 12/2015 | Noriega Gil et al. | |
| 2015/0372636 A1 | 12/2015 | Menard | |
| 2015/0377518 A1 | 12/2015 | Maxey et al. | |
| 2016/0308488 A1* | 10/2016 | Liu | H02S 40/34 |
| 2016/0365825 A1 | 12/2016 | Poivet | |
| 2016/0365830 A1* | 12/2016 | Bailey | H02S 20/32 |
| 2017/0138638 A1* | 5/2017 | Lecube Inchausti | F24S 30/422 |
| 2017/0160372 A1 | 6/2017 | Corio | |
| 2017/0179872 A1 | 6/2017 | Almy et al. | |
| 2017/0294873 A1 | 10/2017 | Mori et al. | |
| 2017/0318919 A1 | 11/2017 | Gharabegian | |
| 2018/0175783 A1* | 6/2018 | Schimelpfenig | H02S 20/32 |
| 2018/0348331 A1 | 12/2018 | Corio | |

FOREIGN PATENT DOCUMENTS

| | | |
|---|---|---|
| DE | 202005012993 | 11/2005 |
| DE | 102005039495 | 3/2007 |
| EP | 2422889 | 2/2012 |
| FR | 2938566 | 1/2012 |
| JP | 06229080 | 8/1994 |
| JP | H1113224 | 1/1999 |
| JP | 2000154625 | 6/2000 |
| JP | 2001164713 | 6/2001 |
| JP | 2003343057 | 12/2003 |
| WO | 199835766 | 8/1998 |
| WO | 1999047761 | 9/1999 |
| WO | 2010055235 | 5/2010 |
| WO | 2014145988 | 9/2014 |
| WO | 2014159566 | 10/2014 |

OTHER PUBLICATIONS

U.S. Appl. No. 15/168,884, Poivet.
U.S. Appl. No. 15/451,340, Poivet.
U.S. Appl. No. 16/505,537, Poivet.
SerbotSwitzerland, "Serbot Product Range," YouTube video located at https://www.youtube.com/watch?v=sfTE3ZgmQ2c, Jan. 14, 2013.
International Application No. PCT/FR2009/001322, International Search Report and Written Opinion dated Jan. 29, 2010.
International Application No. PCT/US2014/024219, International Search Report and Written Opinion dated Jul. 14, 2014.
International Application No. PCT/US2014/030855, International Search Report and Written Opinion dated Aug. 18, 2014.
International Application No. PCT/US2014/030922, International Search Report and Written Opinion dated Aug. 20, 2014.
International Application No. PCT/US2019/040884, International Search Report and Written Opinion dated Sep. 30, 2019, 10 pages.

\* cited by examiner perspective view side view top view

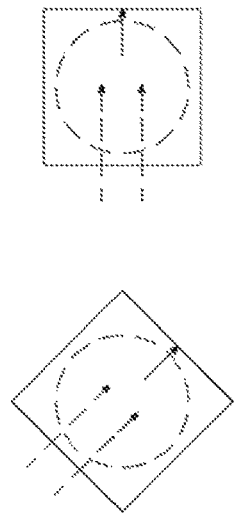
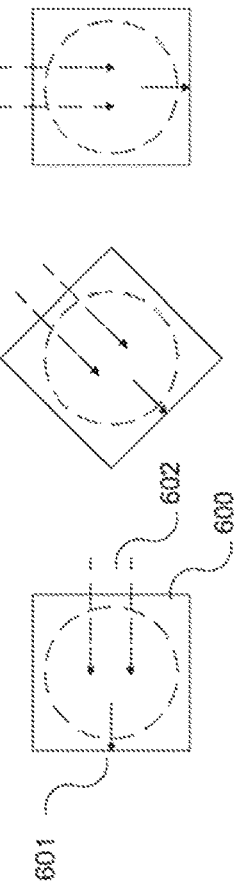
FIG. 6A FIG. 6B FIG. 6C a)

b)

drawing a)

Central axis drawing b)

Piston drawing c)
Motorized wheel drawing d)
Linear motor drawing g)

Belt / chain drawing h)

Rack or pinion

With floating system

MOVABLE BUILDING CROWN

CROSS REFERENCE TO RELATED APPLICATIONS

The present application is a continuation of U.S. patent application Ser. No. 14/970,431 filed Dec. 15, 2015, which claims priority to U.S. Provisional Application Ser. No. 62/092,793 filed Dec. 16, 2014. U.S. patent application Ser. No. 14/970,431 is also: 1) a continuation-in-part of U.S. patent application Ser. No. 14/217,288 filed Mar. 17, 2014, which claims priority to U.S. Provisional Application Ser. No. 61/789,607 filed Mar. 15, 2013; 2) a continuation-in-part of U.S. patent application Ser. No. 14/217,427 filed Mar. 17, 2014, which claims priority to U.S. Provisional Application Ser. No. 61/801,089 filed Mar. 15, 2013; 3) a continuation-in-part of U.S. patent application Ser. No. 13/831,496 filed Mar. 14, 2013, which is a continuation-in-part of U.S. patent application Ser. No. 13/129,378 filed May 13, 2011, now U.S. Pat. No. 8,794,583, which is a national stage entry of International Application No. PCT/FR2009/001322 filed Nov. 17, 2009, which claims priority to French Patent Application Serial No. 0806419 filed Nov. 17, 2008; and 4) a continuation-in-part of U.S. patent application Ser. No. 13/760,965 filed Feb. 6, 2013, which is a continuation of U.S. patent application Ser. No. 13/129,378 filed May 13, 2011, now U.S. Pat. No. 8,794,583, which is a national stage entry of International Application No. PCT/FR2009/001322 filed Nov. 17, 2009, which claims priority to French Patent Application Serial No. 0806419 filed Nov. 17, 2008. All of the foregoing applications are hereby incorporated by reference herein.

TECHNICAL FIELD

The present invention is directed to building construction, and more specifically to aspects of movable building crowns.

BRIEF DESCRIPTION OF THE DRAWINGS

FIG. 6A illustrates rotation of a roof following the sun path, according to certain embodiments.

FIG. 6B shows a section view illustrating a rotating roof to achieve indirect light, according to certain embodiments.

FIG. 6C illustrates technical connections between a rotating part and a fixed part for a rotating roof, according to certain embodiments.

DESCRIPTION OF EMBODIMENTS

Figure 1A:
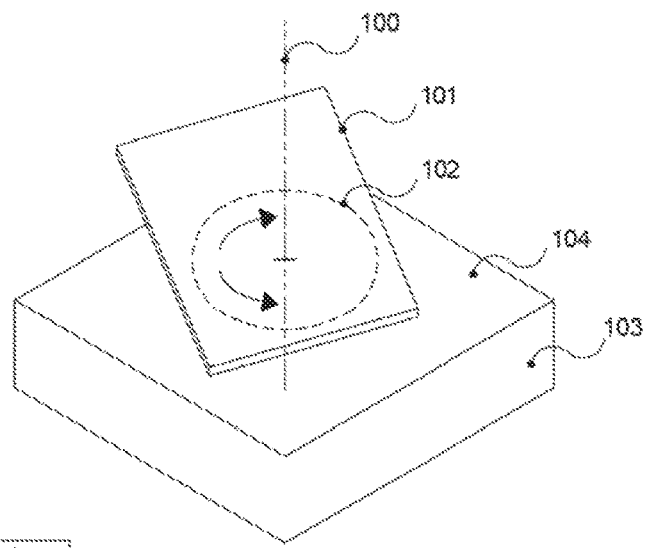
FIG. 1A illustrates a perspective view of a rotating roof on a building, according to certain embodiments.

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

The efficiency of solar panels depends, among other factors, on the sun exposure of the solar panels and therefore on the appropriate orientation of the solar panels. One of the best ways to optimize the production of energy by the solar panels is to ensure that the sensors on the solar panels are placed perpendicularly to the axis of the sun, according to certain embodiments. Since the sun is constantly moving in the sky, it is desirable that the sensors to follow the movement of the sun. The path of the sun across the sky each day covers a different partial arc and in order to follow the sun effectively, the sensors/solar panels need to be conveniently adjustable around both a vertical axis (rotation) and around a horizontal axis (tilt).

It is therefore interesting to create structures that follow the path of the sun. Solutions exist, called "tracking systems" on one axis or two axes, but such solutions generally involve independent installations such as stand alone solar installations in the field, e.g., solar panel installations in solar farms.

It is much more difficult to create moving parts when it comes to buildings. One faces a multitude of problems among which, at least are: structure and stability problems, motorization and control problems, insulation and sealing problems, security problems, etc.

Embodiments of the invention solve some of these problems.

Some of the embodiments may be applied to all sorts of scenarios, including non-energy producing scenario. In certain embodiments, it is desirable that the elements to move or adapt for uses in architecture, design, communication, economy, or specific uses, or for any other reason, even unrelated to solar energy.

The solutions presented herein are not limited to conventional buildings. The embodiments enable the creation of various types of structures, closed or not, permanent or not, fixed or not, with multiple possible functions.

Solutions that involve the movement independent objects, or the rotation of one or more storeys of a multi-storey building (e.g., one or more floors of a building) have certain drawbacks. For example, houses that turn on themselves to follow the sun or where an entire upper floor of the building rotates, creates a lot of difficulties such as discomfort, risks, weight and volumes of the moving parts, coincidence paths with fixed parts, etc., due to the rotation of walls, floors or residential volumes of the building. Thus, according to certain embodiments, only the roof or crown (entire crown or part thereof) of the building or structure rotates or moves.

Rotate the Roof (or Building's Crown)

According to certain embodiments, only the upper part of a building, usually the roof or its associated crown rotates or moves. According to some embodiments, a building comprises a fixed lower part and a mobile upper part, which greatly simplifies the design and realization.

The support of the fixed part of the building can be of any type, fixed or removable, permanent or mobile (the rotating part can be mounted on a system that is itself in motion).

The fixed part is often under the rotating part, but it can also be at the top or on the side, in any position or location in space.

The rotating part can take any shape, volume or function. It can be full or empty, occupied or unoccupied, connected or not to the rest of the building, it can perform external technical functions or not, etc.

Certain embodiments of the invention operate in the following way:

The construction is divided into two parts. The bottom part is fixed, the upper part is mobile. The upper part is designed and equipped to rotate.

The rotating part is based either on a circular support (circle or partial circle) attached to the bottom part (which can be any kind of support structure, any shape and any suitable material) or on a central axis, possibly supplemented by a peripheral system (including closure, guidance, etc.).

Depending on the conditions of application, there may be, on or near the circle of contact between the rotating part and the stationary part, support, insulation, sealing, control, management, or motorization equipment, etc.

This contact circle can be achieved in different ways, as a result of the functional requirements.

The support/guidance of the higher loads of the movable part can be achieved in particular by means of wheels traveling along a curve, by magnetic levitation, by floating on a liquid, etc.

The rotation of the movable part can be motorized. The motion can be achieved in particular through the central axis (if any) or at the level of the peripheral circle, if any.

The rotation of the movable part of the building can be controlled remotely or controlled manually, or by intelligent systems, possibly using positioning systems.

The movements, particularly their nature, speed, amplitude or rhythm, can be managed in accordance with a set of internal or external parameters associated with the building, environment, climate control etc.

In some cases, it may be desirable to ensure the insulation or sealing between the moving part and the fixed part of the building.

It may be desirable to seal or insulate between the inside and the outside of the building or structure, which is often difficult in mobile systems. The sealing can be done at the level of the supporting circle and may use various technologies, including, in addition to the conventional seal or brush system, the liquid sealing solution described below.

It may be desirable to ensure the circulation of fluid, information or energy, which may imply specific technical provisions.

Steps can be taken to avoid vibrations or uncontrolled movements.

If solar equipment is used for the mobile part, thus optimizing the production by tracking the course of the sun with sensors, one can take advantage of the electricity or thermal energy produced by using technology that allows such energy to be extracted from the solar system. Managing the rotational movements can therefore take into account the movement of the sun among other parameters.

Depending on the location of the building, its design and its movements can take different forms.

The mobile part of the building is often the crowning roof of the construction. However, the moving part of the building does not necessarily have the function of the roof and is not necessarily the upper part of the construction. Numerous cases are possible. For example, a building may have multiple sections of different heights (as seen from a side view) and the moving part of the building is at section of the building that is shorter than other sections of a building.

One of the interesting applications of certain embodiments is the creation of solar greenhouses, as described below.

Many other applications of the embodiments are possible. For example, applications for technical or functional uses, for architectural uses benefitting from the effect of motion, or communication uses are possible.

In the case of buildings, the embodiments can lead to the creation of highly innovative buildings, in their form, their function or use, their engineering or their management.

In some embodiments, technical solutions are developed to industrialize in order to achieve economies of scale, which reduce costs while improving the quality and reliability of the creations.

The general principles described herein are usable in a multitude of different application cases. Technologies or products developed solve different cases and different scales or can be combined to allow the production of a multiplicity of different configurations.

Fixed Part, Mobile Part, Application Cases

Depending on the specific applications, the fixed and mobile parts of the building or structure can take different forms, sizes and configurations.

For purposes of illustration, the following cases are described. Note that these cases do not represent the entire range of possible solutions, rather they are described to better understand the principles of various implementations of the embodiments.

One can design a single-level building of which the fixed portion is constructed in a conventional way, except that the roof or a portion of the roof could turn on itself, and is visible from the inside or not. At the meeting point between the fixed part and the mobile part of the building, a system of rail and circular closure ensures the independence of both the fixed and mobile parts. According to certain embodiments, the fixed part is high enough for the access doors to be included in the fixed volume, thus eliminating the risks of collisions, for example, when the upper part rotates. The lower fixed part is designed to bear the loads of the moving part. The system can also be designed so as to benefit from the rotating part (moving part) in terms of energy, volume and light changes, etc. Such an application may be applied to residential or professional buildings, commercial or industrial premises, exhibition spaces, in greenhouses, in functional technical systems as well as in various architectural applications in plastic works of art or mobile sculptures, etc.

On the other hand, one can imagine a greenhouse occupying the top of a high-rise building in order to provide the neighborhood with quality food. Given that many towers have a square or rectangular shape allows for the ideal inclusion of a circular structure. The design of a greenhouse with a rotating roof is described below and is not repeated here. In the case of a greenhouse at the top of the tower, one can imagine that such a greenhouse can be accessed from the lower level and therefore almost the entire greenhouse (floor to ceiling) can be the rotating part. One may also conceive the set so as to add a rotating function around a horizontal axis as well as a vertical axis, to best follow the movements of the sun. This only an example and a rooftop greenhouse can be made with a fixed part, or any other variation.

Another example: one can conceive non-closed, rotating structures for cases that do not require insulation or sealing functions. Examples include parking lots, agricultural structures, meeting venues or outdoor shows, urban development, etc. In such cases, the fixed part may be limited, or not exist at all.

Another example: the principle of single or multiple rotating parts can be used for the top of large housing complexes, offices, commercial and industrial facilities, in order to add architectural qualities to these buildings, to improve their performance or quality of life, or to offer new usages or functions, or to improve their energy performance. Non-limiting examples include a multiplicity of small rotating parts for the roof or for the façade of large building complexes, possibly multi-storey buildings.

Another example: many cases of applications involve constructions that are not buildings in the traditional sense, but new applications exploiting the potential of the new solutions described herein.

The rotating part may have any shape, volume, weight, material or use. It may rotate on a vertical axis or on any other axis, for example a tilted axis. One can combine a rotation on one axis (for example vertical) and another movement in another direction, so as to allow more complex movements (movement in multiple degrees of freedom). One can imagine, for example a construction that rotates on a vertical axis and that may have another movement on a horizontal axis (itself optionally turning on the vertical axis), in order for example to better follow the sun or adapt to wind changes, or to create structures that are useful for one reason or another.

Having a moving part has obvious consequences in terms of design, construction and use and generates many innovations in these areas.

Support, Guidance and Motorization

In contrast to traditional and fixed constructions, whose structures and envelopes are continuous from the floor to the top, we have two distinct parts (a movable part and a fixed part) that must be made interdependent in some ways while remaining independent in other ways and of which the mobile part should be set in motion and controlled. If problems of stability, control, engine or sealing arise, the large number of possible cases of application requires a range of solutions to solve the constraints imposed by most cases.

To illustrate how to resolve these issues, consider the simple example of a building of which the lower part is fixed and the upper part rotates on a vertical axis to follow the sun.

Consider two main cases: 1) with a central axis, and 2) without a central axis.

With a Central Axis

A vertical support, such as a pole, is positioned at the axis of rotation and supports most of the vertical loads of the rotating part, according to certain embodiments.

In some configurations, this axis can also provide the motorization of the whole rotating part. This application is sufficient in some cases.

In other cases, one may have to meet requirements of closure, sealing, insulation, motorization, or stability, which will bring the designer to implement circular devices on the limits of the rotating part (e.g., near the periphery of the rotating part or near/at connection points between the rotating part and the fixed part of the building or structure. These devices are thus similar to those encountered in the case where there was no central support as described below.

Without a Central Axis

In this configuration, the load is supported by a rotating peripheral device located in a plane perpendicular to the axis of rotation, and may be placed near the meeting point between the fixed and the mobile part (but this is not strictly necessary). Such a system or similar systems, may also perform motorization functions, motion control and sealing.

In this configuration, there would thus be a fixed part of any shape and nature and a mobile part of any kind and form rotating on a vertical axis. The rotating upper part would rest upon the fixed central axis and would be motorized. Thermal insulation and sealing may be necessary in some cases.

Described below are several solutions to each of these problems.

Support and Guidance

Three solutions are envisaged to ensure the support and guidance of the upper part. The choice of the solution and its design will depend on the characteristics of the project and the constraints to be solved (dimensions, functions, loads, climate, nature and use of the structures to be created, types of movements of the movable part of the building, etc).

The final quality of the whole building will depend on the quality of the supports and of the main guidance. Prefabrication systems can be considered for better quality control, as well as precise horizontal and vertical adjustment of the systems.

Thermal expansion, the wear and tear of the systems and the gaps caused by time are taken into account by correction devices, according to certain embodiments as described herein.

Self-centering systems that naturally return to their former place when they drift can be used. It is to be remembered that the construction of buildings and structures is a dynamic system subject sometimes to considerable internal and external constraints (wind, ground movements, etc.). Some of the support solutions described below are "without rigid contact" and has the benefits of reduced effort and noise, and can allow greater flexibility of lateral or vertical movement, especially in case of strong wind (e.g. lifting effects during a hurricane). In most cases, this phenomenon can be resisted by combining the apparatus with a system of lateral and vertical control. The need to maintain, for some applications, the mobile part in a strict geometric figure, may require appropriate corrective action. In addition to mechanical control devices, systems of pressure variation, or magnetic field may also be used, to counter the variations of external constraints.

In some cases, the support/levitation system is supplemented with a directional guidance systems to control the course and the lateral position of the mobile part. This control can be based on the rotation of an arm that stretches between the axis of rotation and the periphery of the mobile part, but this requires the existence of an axis or a centre point accessible without constraints. In other cases, in order to keep the central space free from constraints, one can implement a system of circular guidance on all or part of the circle, or on several points, of the mobile part of the building, for example by using a system of rails and rollers possibly combined to a blocking system. The blocking system is such as to stop the movement of the mobile part of the building or to prevent the mobile part of the building from separating from the fixed part of the building (for example separation can occur due to a strong gust of wind).

Moreover, it is essential that the rotation of the mobile part of the building/structure should be smooth, without shock or vibration, and that the whole is not affected by movements, noise or distortions caused by efforts from the outside (e.g., wind). Specific arrangements can be put in place to ensure smooth rotation.

Embodiments that Use Wheels

In these embodiments, we implement, in a plane perpendicular to the axis of rotation, a circular rolling track on all or part of the 360 degrees of the circle (in some cases, we can set up a rail non perpendicular to the axis of rotation, or a rail that is not planar so as to provide the moving part with a different path). This rail is generally supported by the fixed lower structure or by an independent structure.

This track/rail is designed to support and guide the wheels supporting the moving part. Depending on the circumstances and constraints, including its own load and/or external load, the speed or noise, this rolling system may be made up of wheels running on a rail or of wheels+tires rolling on a rigid support such as a metal rail, concrete, etc., as examples. These wheels can be fitted with brakes or engines like railway systems, for example.

In some cases, the wheels systems, possibly multiple or combined with others, will also perform guidance functions and limit the movement.

Embodiments that Use Magnetic Levitation

In some embodiments, one may use magnetic levitation to lift the mobile part a few millimeters above the circular support.

A magnetic levitation system that bears the weight of the roof is much quieter during rotation and has less resistance to movement.

In some configurations, the magnetic levitation ensures the lifting, guiding and control of the mobile part, even if the axis of rotation is not vertical.

Embodiments that Use Hydraulic Lift

In some embodiments, we can support the rotating part of the building with a system that relies on a suitable liquid and is upheld by pressure. This may include different solutions ranging from free floating on a water plane to systems with hydraulic or hydro pneumatic pressure, which may have the advantage of combining support guidance and sealing functions (see below for the sealing system). Aspects of support guidance and quality issues are previously described herein.

Motorization

Motorization as referenced herein does not necessarily mean motorized. Motorization can mean manual operation or being driven by other forces.

In the case of movements designed to follow the sun's path, the circular movement required is slow because it is very rare to exceed the value of 180 degrees in 12 hours.

Most application cases present a control problem: in some cases it may be necessary to block the rotation to avoid damage, e.g., a stormy weather will tend to push the movable part into extreme movements. These systems should be complemented by brakes or locking means for locking the components in a complete stop. These devices can be combined with those described above which relate to the lateral and vertical guidance.

Embodiments Using a Central Mast

In embodiments where the construction has a support on a central axis, this axis may be used to generate the rotary movement of the upper part. The axis itself can rotate over its entire height (either the mast itself or a motorized mast attached to it) or be fixed and include a motor near its upper end.

In the case of a non-driven central pole or no central pole, the movement can be transmitted to the upper part from the periphery. Among a wide range of possibilities, some solutions include:

Motorized wheels: In some embodiments, we may use the supporting wheels according to the principle similar to that of railway systems. One or more motors drive one or more wheels and rotate the movable part of the building or structure. These wheels may be those which support the weight of the mobile part and the wheels roll upon a horizontal support or rail, or other wheels, such as those for lateral circular guidance, or wheels dedicated or attached to the fixed part.

Magnetic propulsion: In some embodiments, a magnetic propulsion may be used. For example, a derivative of the linear motor principle can be used on all or part of the circle. In some cases this propulsion function can be combined with support and guidance functions.

Hydraulic propulsion: In some embodiments, particularly in the case of a hydraulic lift, one can also work with a hydraulic flow that smoothly and quietly moves the elements. This solution is very economical, reliable and quiet but less accurate in the control of angular motion. It is adapted to slow, steady motion, but is less suitable for configurations that require an ability to withstand significant forces from external sources (e.g., the need to resist the wind forces or the need to maintain a precise position). Optimization of the driving performance of the hydraulic force can be made by equipping the mobile part devices acting as blades in the liquid (acting like paddle wheels).

Direct drive by actuators: In some applications, and if the movements are of low amplitude, we can use angular pushing systems through hinged pistons, acting either on the periphery or on inward radiating arms.

Direct circular mechanical drive: In some embodiments, a direct mechanical circular drive will be introduced. In this case, the mobile part has a circular peripheral support device on which acts the force of propulsion. In some embodiments, we can use one or several motorized wheels, attached to the mobile part and placed inside or outside the supporting circle, pushing laterally. It may also have a system of chain+pulley or belt+pulley, with the chain or the belt resting on the outer surface of the circular support designed for this purpose. This system may require protection against external aggressions. We can use a circular rack type system moved by a gear motor placed and placed inside or outside of the circle.

Sealing

According to certain embodiments, the following solutions can be used: 1) sealing gaskets and 2) liquid sealing. It should be noted that even if the particular case of implementation requires only a rotation of amplitude under 360 degrees, the sealing issue concerns the entire 360 degrees.

If the project uses a guidance/support located near the outer circle, one can, in many cases, wish to protect the system against external aggressions that may disturb the operation. Sealing solution implementation depends on the context of use. For example, implementation of sealing solutions can vary from case to case such as in the case of sand or leaves hindering the wheels from rolling on the rail; or of objects or particles damaging the systems; or of objects/metal deposits disturbing the magnetic systems; or temperature changes disrupting the liquid systems; or objects causing leaks, blockages, overflows, etc. One implementation the system is to isolate the interior of the building from the outside when the atmosphere inside is more peaceful, or vice versa, or we may wish to protect both sides. The sealing systems are designed appropriately according to the case at hand. Support guidance systems in most cases are designed to remain accessible.

Sealing Gaskets and the Like

In some embodiments, sealing can include using a peripheral circular rail providing a flat and continuous support/ surface to install a simple peripheral seal.

In this configuration, the rail can have a favorable profile with either a groove or a relief that would embrace a seal or a peripheral brush attached to the moving part. This seal can be single layer or multiple layers. If the profile or the implementation of the rail does not allow such a solution, then the seal assembly can be located further inside or outside of the circle, or both. In this case, the seal system may not be vertically in the same plane as the rail.

Joint sealing on large mobile structures such as the one discussed herein will probably not result in a perfect seal, but it will be sufficient for many applications. In addition, since the joints work by friction they are subject to wear and gradually decline in performance, thus they need to be replaced at regular intervals. In addition, the friction of the seal will slow down the rotation.

Liquid Sealing

According to certain embodiments, another solution such as liquid sealing can be used, which provides a perfect seal and requires very little maintenance.

One implementation of the solution includes a thin circular peripheral channel filled with a suitable liquid and attached to the fixed part of the building. The movable part comprises a peripheral, which is immersed in the liquid over the entire circumference of the circle. This sealing system does not allow in most cases for gas or particles to pass through this barrier and heat transfers are also blocked.

One may worry in some cases about a heat transfer phenomenon (thermal bridging) when using liquid sealing since the same liquid is in contact with both the inside and outside. But besides the fact that this solution is thermally superior to the joint sealing version in that it does not let any air in or out, it should be noted that the width of the channel can be greatly reduced to allow only very small heat transfers. Moreover, having dual channels for the liquid sealing will remove this problem.

This channel for the liquid seal can be integrated into the rail itself, if there is one, which allows it to benefit from the same workmanship, thermal expansion and management qualities. If the rail device is made of several parts, junction solutions can be implemented.

Another good solution is to create this "channel" for the liquid sealing with a metal sheet folded and bent on site so as to obtain a continuous profile without a junction over the entire length of the periphery with the exception of the single point closing the circle.

The only constraint is to ensure that the channel is properly filled with liquid, which can be done automatically, and to ensure that the channel does not leak.

The nature of the liquid will be determined by conditions (temperature, sand, people risk, risk of pollution, the presence of gases or flames, etc). A small amount of liquid is necessary to achieve the physical barrier between the inside and the outside of the building. A drainage system can be used to regularly replace the liquid.

The sealing liquid solution implements itself optimally when the plane of rotation is horizontal and flat.

All filling, sealing, drainage and control devices are included in the system.

When the support of the rotating part is made by hydraulic lift as described above, the same liquid bath may, in some cases, fulfill support, sealing and even motorization functions.

According to certain embodiments, the "channel" is much wider and deeper, and filled with a lubricant liquid. The system of rails and rolling wheels described above can then run permanently on the lubricant, which significantly reduces the risk of noise and wear in exchange for an increase in the volume of liquid (which can cause problems of cost or risks of pollution in case of leakage or accidental discharge/drainage).

Sample Application: Rotary Greenhouses

A greenhouse is a structure that is designed to allow plants to grow in inadequate climates or seasons. Greenhouses are thus climate control constructions, created to fight the climate or rather to recreate inside the greenhouse a climate that is better adapted to the objectives of the operator of the greenhouse.

The greenhouse, which has changed very little since its initial development in the 19th century, can be reinvented as a machine to modify the internal conditions, and to modify the relationship between the interior of the building and the exterior of the building.

This simple illustration as described herein demonstrates that there are numerous applications, including projects aimed at providing real or perceived conditions inside the greenhouse, different from what they would be without these solutions.

According to certain embodiments, the greenhouse becomes multifunctional and solves a much larger number of climatic problems than the previous generation of greenhouses.

The traditional greenhouse is generally designed to achieve inside conditions of light, temperature and humidity different from those prevailing outside. They also help to protect crops against external aggressions (wind, rain, hail, animals, people, etc).

Currently, greenhouses are usually warm inside in order to grow plants, which requires a warm and wet climate and the conditions outside of the building does not provide. But the opposite case is theoretically possible as well as a full range of other cases. Greenhouses are generally heated and very energy consuming.

The desire for a difference between indoor and outdoor conditions is not unique to greenhouses but applies to the majority of world's buildings and what we describe here will be valid also in many other buildings other than greenhouses.

In addition, the greenhouse is usually made of glass, or of transparent or translucent materials in order to let in the light necessary for the plants. The inside of the house is often lit, for example, to allow plants to grow 24/24 or i.e., to grow heat loving pants like tomatoes in the winter. But the greenhouse is often not very thermally insulated and offers very little thermal inertia with the slightest variation in outdoor light (a sunbeam or a passing cloud) resulting in an increase or a sudden drop in temperature. However, plants often require stable conditions and these variations in conditions are unfavorable. Finally, in the hot season, the greenhouse which is designed to multiply the effects of a pale winter sun, is suddenly too bright and too hot. One then has to open the greenhouse, ventilate or even cool it, and protect it from the sun by covering the translucent parts of the outer skin of the greenhouse. As a precaution, currently one might even build the greenhouse with opaque facades or roofs where they are exposed to the sun (south in the northern hemisphere).

The greenhouse is by nature a thermal and energetic challenge. It is also an area of the construction field that needs a revolution with a new approach and new technologies as described herein.

In addition, progress in agriculture, including hydroponic agriculture, open new possibilities for greenhouse cultivation, while requiring different technical conditions.

Solar Greenhouses

We have seen that the greenhouses are often built with the south sides (for the Northern Hemisphere) made opaque to protect plants from excessive sun. In addition, the greenhouses consume a lot of energy and extend over large areas.

It is therefore possible to create greenhouses by replacing the opaque skin with a solar photovoltaic or solar thermal skin, and thus transform an agricultural field into a solar field.

If, in addition, the solar technology allows to recover heat from the panels and use it to heat the greenhouse or for other uses, efficiency and profitability will be highly improved without any loss of crop yield.

The non-insulating translucent skin can also be replaced with an isolating skin. A good way to do this is to use, for example, for the side façades, an inflatable translucent and flexible double skin product: the layer of air acts as insulation. But if the skin is inflated with hot air to heat all or part of the roof (if using appropriate solar technology), the greenhouse is heated at the same time at a low cost.

If the solar technology includes the use of water or hot air, cooling can also be produced and the greenhouse can be cooled to maintain ideal conditions. Some hot water for agricultural uses may also be produced.

In addition, the electrical energy supplied in large quantities by large areas of photovoltaic greenhouses can be used for treatment of water, including groundwater pumping and desalination of saline water, seawater or groundwater. This could allow, different applications such as farming operations in deserts, especially if hydroponic agriculture is used which requires very little water.

Rotating Solar Greenhouses

Consider combining the solutions for solar greenhouses, including the use of appropriate solar technologies, and the solutions described above in terms of rotating roofs.

As described above, we have a greenhouse that produces energy and heat and that protects itself from the sun. The problem is that, when the solar part of the roof is fixed and opaque, it is inefficient for at least three reasons:

1) A portion of the surface of the greenhouse is not exposed to light because it is in the shadow of the solar roof.
2) The solar energy collection is only as efficient as the fixed systems (non-movable systems) allow it to be, which do not follow the path of the sun. Solar energy performance increases significantly if the solar sensors optimally follow the path of the sun (20 to 40%).
3) If the greenhouse is built using a technology that puts solar panels directly in contact with the inside of the greenhouse, these panels will produce uncontrollable condensation and heat effects.

According to certain embodiments, a solution is to add the rotary function to the solar greenhouse described above and use a set of technologies for thermal control.

The greenhouse is divided into two superposed parts: a fixed lower part, generally but not necessarily high enough to provide a passage to the fixed portion, and a mobile rotary upper portion made up partly of solar sensors and partly of non-solar materials, and possibly translucent.

The fixed part can be of any shape or size. The upper part can also be of any shape or size. A circular contact point and a plane exists between the two volumes to allow:

for support of the movable part
for implementation of the drive and guidance, and
for the sealing.

The mobile part can rotate on one axis, which is generally close to the vertical/nearly vertical, but this rotation can also be combined with a horizontal axis to follow the course of the sun on two axes.

Ideally, we use a technology that allows for:
a structural solar skin insulated and sealed,
a fine and reliable guidance of the motorized rotation,
production of electricity or hot water,
generation of heat and reuse of this heat to produce heat or cold, and
recycling the water, including condensation water.

Furthermore, and depending on the shape of the rotating roof, we may free up large volumes in height if necessary, and then manage the rotation of these volumes as needed.

Since the opaque part of the roof rotates:

It can follow the course of the sun in an ideal way to maximize solar performance and therefore the production of electricity and heat.

The shadow on the ground is also rotating and does not always affect the same cultivated areas. Many areas are exposed to light in turn. The agricultural efficiency is thus higher.

Protection against excessive direct radiation is much higher than what we would obtain with fixed opaque panels because we always block direct sunlight In addition, the greenhouse can be equipped with ventilation or thermal protection devices to regulate heat gain due to light and heat fluxes.

We can therefore make a greenhouse that optimizes the agricultural production, and produces more energy than it consumes (which can feed other systems: communities, food processing or storage, etc.), and heats or partly refreshes itself and consumes little water.

Thermal Control

If the greenhouse is built with a technology that allows for the extraction of hot air from the roof, we can add technologies to integrate that heat to the thermal management of the greenhouse.

This real-time thermal management may, in some cases, lead to modify some settings in the greenhouse, such as rotation, ventilation and thermal protection.

Kit

Greenhouses mounted in kit, solar hydroponics, can be set up in a short period of time and quickly provide food, fuel and energy for a whole community.

Water, plants and nutrients are delivered at the same time. The electrical system is pre-wired. The set/system comes with kits of wedges for adjustment, instructional videos, and spare parts. The operators (technical and agricultural) can be brought together.

According to certain embodiments, the greenhouses are delivered in modules to be assembled in order to create large sets from small units. Modules operate either individually or as a group. Each module is autonomous.

DESCRIPTION OF THE DRAWINGS

Buildings are all different and the expert in the field can generally choose from various solutions to design and construct a building. Therefore, we provide both a set of principles and a toolkit of technologies, which constitute a system that can be used in a large range of applications. The solutions described herein enable the creation of various embodiments of different types of construction at different locations. Some of the solutions described herein can also benefit other projects or other purposes.

The drawings described herein are for illustrative purposes and are intended to show a few sample applications. They are not exhaustive, rather they are intended to illustrate the main principles and to show the kind of toolkit and new possibilities the embodiments provide.

These solutions are an asset to the building's architecture.

FIGS. 1A-C

Most types of buildings (103) can be equipped with rotating roofs (101), no matter the shape or the function of the building. The same is true for rotating facades or other mobile parts.

The building (any type of building) provides a fixed lower part (104) and a rotating roof (101) that constitutes a part of the building roof. The rotating part (101) can have various shapes, sizes or functions, including the one of not being classically a roof (for example if it is not waterproof). In this example, the fixed part (104) is high enough to include regular size doors or passages in order to provide a safe access into the rotating volume (doors are avoided in a rotating wall).

These schemes show any type of regular building (103), with any shape or function, which has any type of classical roof/fixed part (104), but a part of it is here replaced with a rotating roof (101). The mobile part rotates around a vertical axis (100). It can rotate from 0 to 360 degrees. The axis of rotation can be located any where on the building or around it.

Figure 1B:
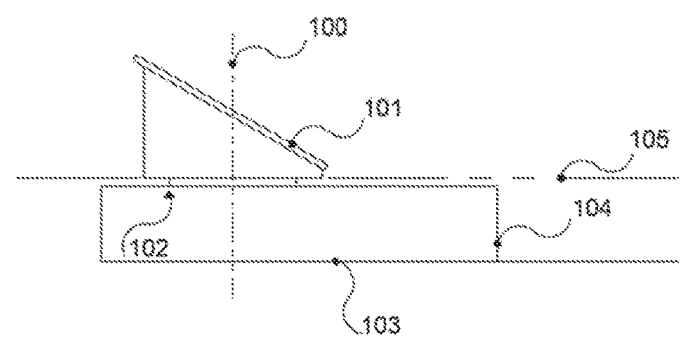
FIG. 1B illustrates a side view of a rotating roof on a building, according to certain embodiments.
Figure 1C:
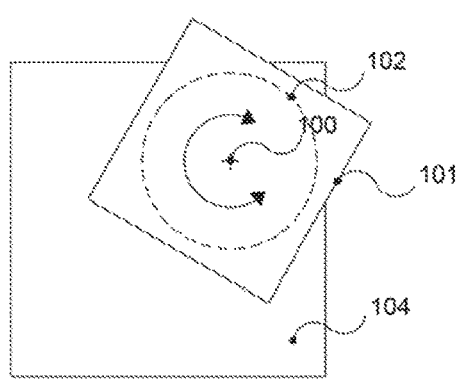
FIG. 1C illustrates a top view of a rotating roof on a building, according to certain embodiments.

The plane of rotation (105) is the contact point between the rotating (mobile) part (101) and the fixed part/classical roof (104). Depending on the shape of the rotating part, the contact point can be a circle line (102), a circular area, a ring, etc. In the example shown in FIG. 1A-C, the axis of rotation (100) is vertical and the plane of rotation (105) is horizontal. In this case, the point of contact between the fixed part/classical roof (104) and the rotating part is located sensibly at the level of the classical roof, which means that the rotating part begins just above the level of the fixed part/classical roof (104). This plane of rotation (105) could be located at any height.

In the example shown, the rotating part (101) is made of a large sloped rectangular plane (it could be, for example, equipped with solar panels) and of a segment of a cylinder cut by the sloped plane. They rotate together but there is no need for the rotating part to be circular, nor to be centered on the axis of rotation. The rotating part can be of any shape or volume.

However, if any kind of closure is wanted, this closure will have to take place on the contact line (102). Even if the rotation is only of small angular amplitude, the closure issue will be faced on the whole 360 degrees.

FIG. 2A-C

Figure 2A:
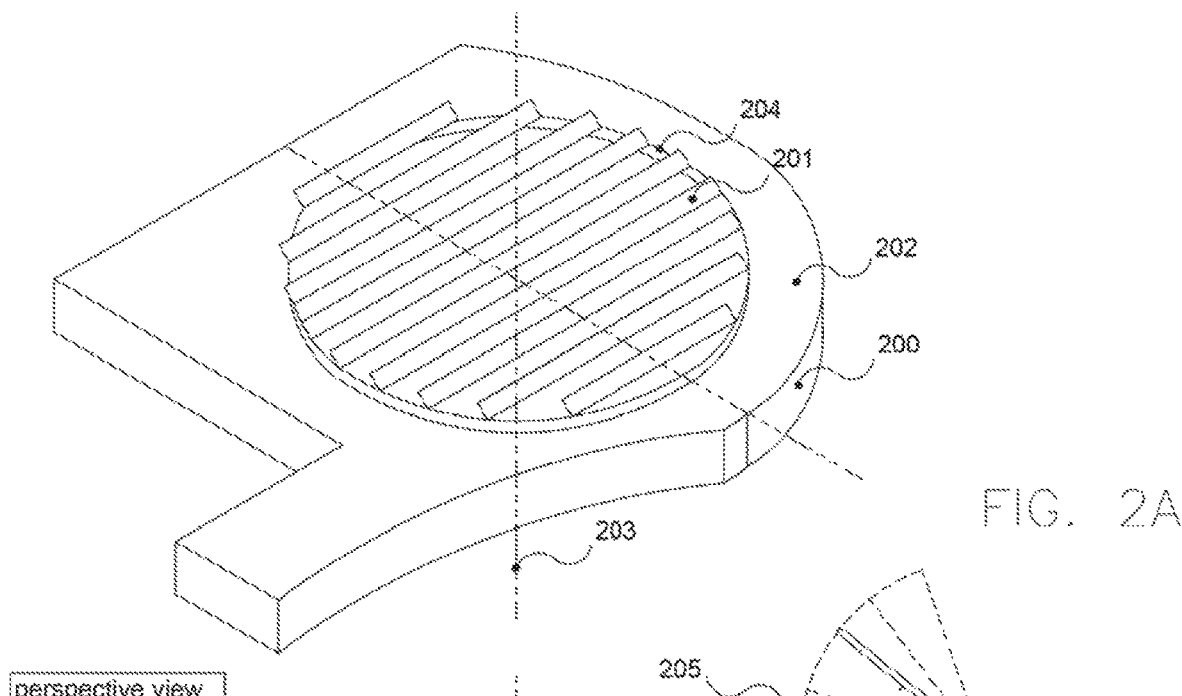
FIG. 2A illustrates a perspective view of another sample rotating roof on a building, according to certain embodiments.
Figure 2B:
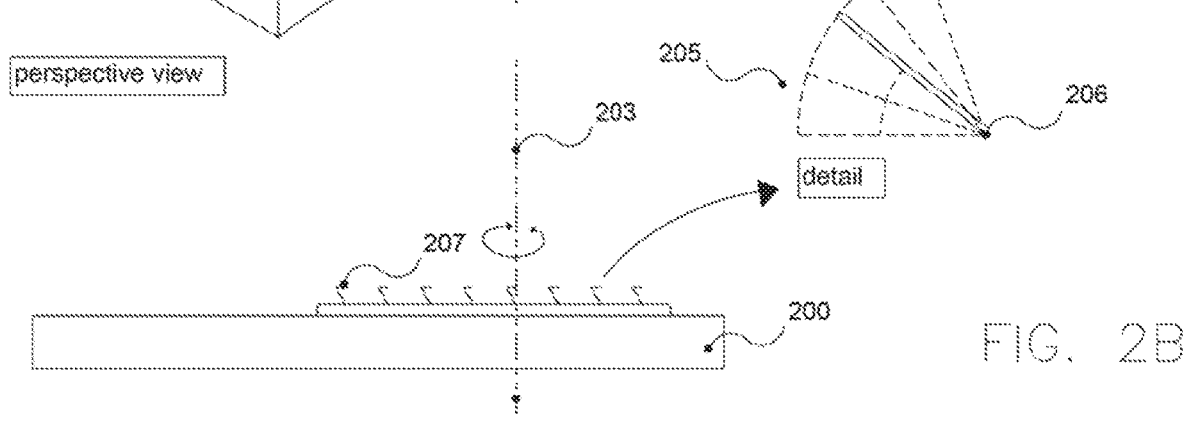
FIG. 2B illustrates a side view of another sample rotating roof on a building, according to certain embodiments.
Figure 2C:
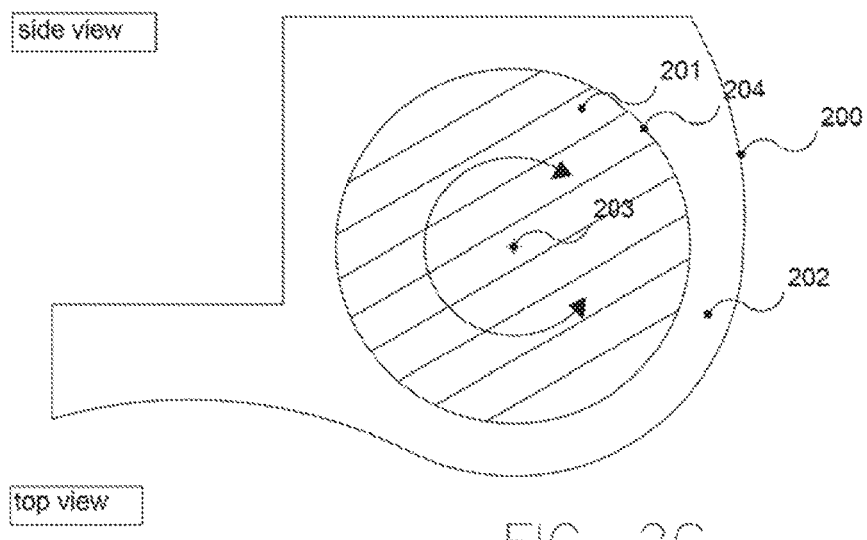
FIG. 2C illustrates a top view of another sample rotating roof on a building, according to certain embodiments.

Most types of building (200) can be equipped with rotating roofs (201), no matter the shape or the function of the building. In the example shown in FIG. 2A-C, a regular building provides a fixed lower part (202) and a rotating roof (201) (rotating part or mobile part) constitutes a part of the building roof. The rotating part (201) can have various shapes, sizes or functions, including the one of not being classically a roof (for example if it is not waterproof). These schemes shown in FIG. 2A-C are suitable for most types of regular building, with any shape or function, which has any type of classical roof, but a part of it is replaced with a rotating roof. The mobile part rotates around a vertical axis (203). It can rotate from 0 to 360 degrees. The axis can be located anywhere on the building or around it.

The plane of rotation is the contact point between the mobile part (201) and the fixed one. Depending on the shape of the rotating part, the contact point can be circle line (204), a circular area, a ring, etc. Since the axis of rotation (203) is vertical, the plane of rotation is horizontal. In such a case, the point of contact between the fixed part (202) and the mobile part (201) is located sensibly at the level of the classical roof, which means that the rotating part begins just above the level of the fixed roof. The plane of rotation could be located at any height.

In the case shown in FIG. 2A-C, the rotating part (201) is made of a large flat disk whose top has sensibly a saw tooth roof shape (it could be, for example, equipped with solar panels). FIG. 2A-C also show that the elements that compose the rotating part (201) can be themselves animated with their own motion (205) (see detail). In this example, the rotating disk (201) is covered with long sloped elements, which can be hinged from their bottom to rotate on an axis (206) parallel to their bottom line, while this bottom line is itself rotating with the disk on a vertical axis (203). The long sloped elements (207) can be simply attached on top of the waterproof rotating disk or provide the sealing function. The fixed part (202) that supports the rotating part is called fixed in opposition to the rotating one, but it may however be itself animated by its own movements.

FIG. 3A-B

Figure 3A:
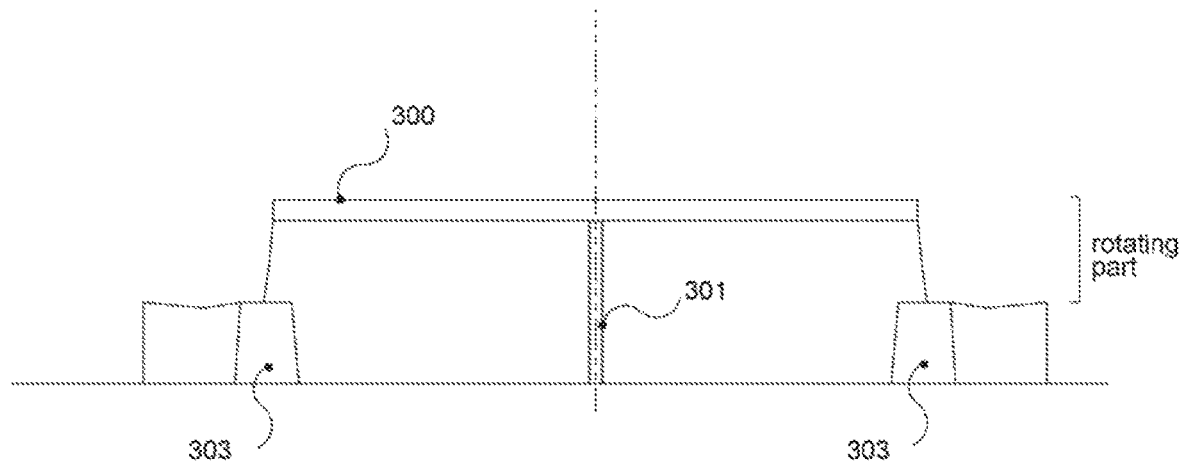
FIG. 3A illustrates a side view of a sample rotating roof supported by a central structure, according to certain embodiments.
Figure 3B:
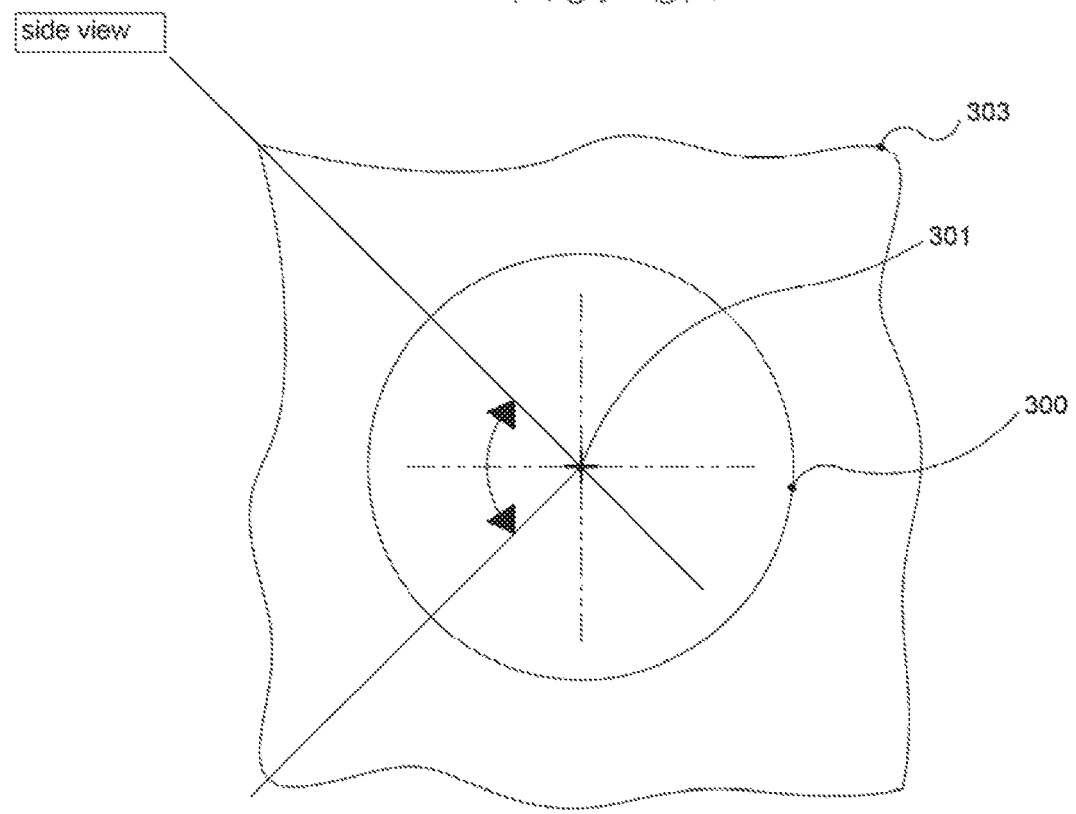
FIG. 3B illustrates a top view of a sample rotating roof supported by a central structure, according to certain embodiments.

The FIG. 3A-B show a side view and a top view of a sample case of application in which the rotating part (300) is supported by a central structure (301). The rotating part (300) can have any shape, volume or function and can rotate with any desired angular amplitude. These figures also illustrates a case of application in which the fixed peripheral part (optional fixed part 303) is not the supporting part and can take any form. The side can even be unclosed.

FIG. 4A-C

Figure 4A:
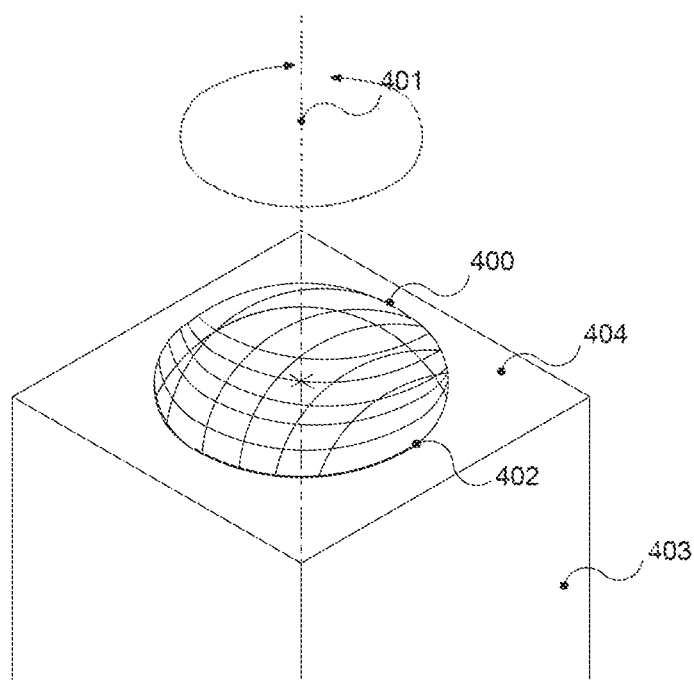
FIG. 4A illustrates a perspective view of a rotating greenhouse that is on the top of a high-rise building, according to certain embodiments.
Figure 4B:
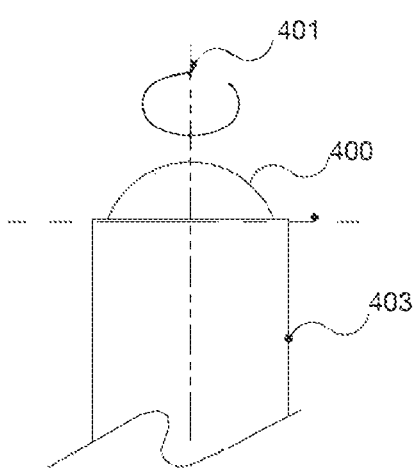
FIG. 4B illustrates a side view of a rotating greenhouse that is on the top of a high-rise building, according to certain embodiments.
Figure 4C:
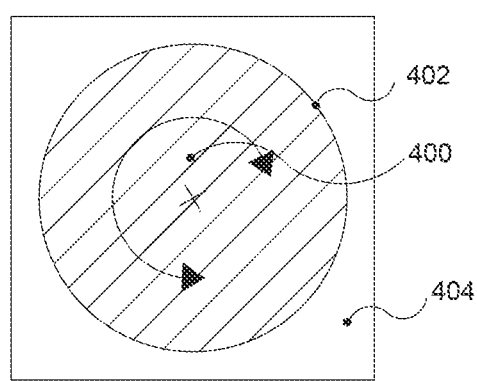
FIG. 4C illustrates a top view of a rotating greenhouse that is on the top of a high-rise building, according to certain embodiments.

FIG. 4A-C illustrate an embodiment of a rotating greenhouse (400) that is on the top of a high-rise building (403). Such a greenhouse can provide fresh food to the neighborhood for example. In this example, the access to the inner space is provided directly from the lower floor through stairs for example and there is no need for a fixed peripheral wall. The rotating part (400) replaces most of the building's roof (404).

In this example, the rotating part is a portion of a sphere, made of glass and other materials, such as solar panels, and it rotates to keep up with the sun's best alignment or for other reasons. It rotates around a vertical axis (401) and the contact line (402) is the circle formed by the sphere intersecting with the slab.

FIGS. 5A-C

Figure 5A:
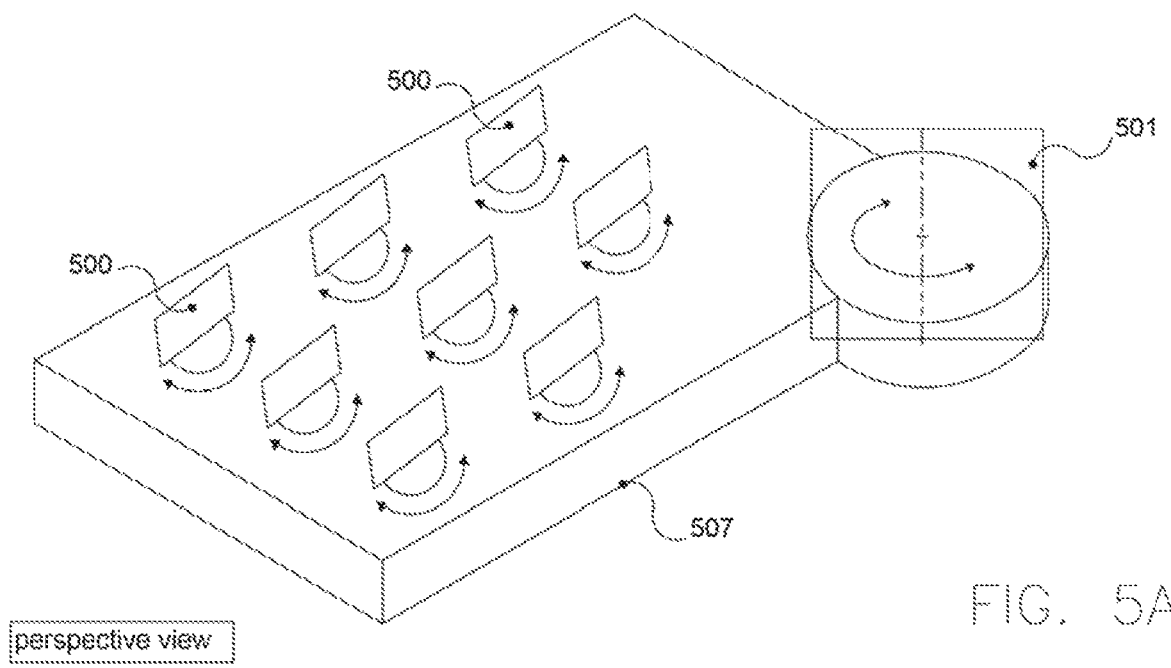
FIG. 5A illustrates a perspective view of a sample scheme with several rotating roofs on a building, according to certain embodiments.
Figure 5B:
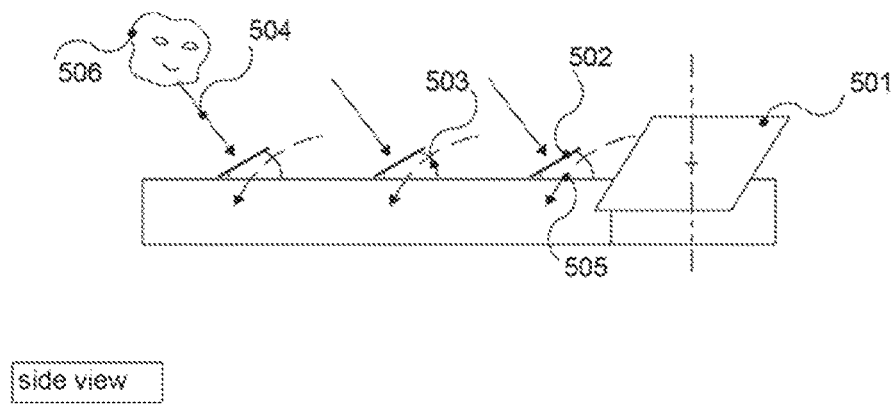
FIG. 5B illustrates a side view of a sample scheme with several rotating roofs on a building, according to certain embodiments.
Figure 5C:
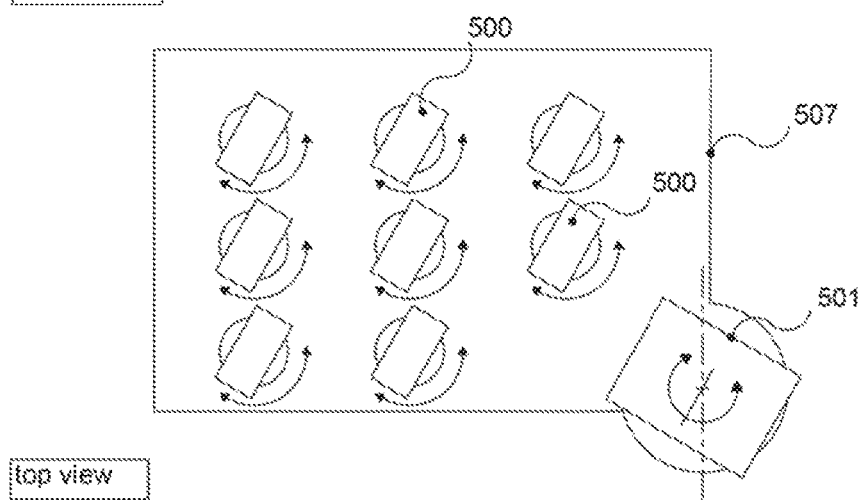
FIG. 5C illustrates a top view of a sample scheme with several rotating roofs on a building, according to certain embodiments.

FIGS. 5A-C show an example with several rotating roofs, in this case one large (501) and eight small ones (500). In this example, they are designed to provide natural lighting to an office building (507) while producing energy. They could be implemented for any other reason. The rotating parts (500, 501) are essentially made of a sloped opaque part (502) that cuts or collects the direct sun rays (504) and of a translucent or transparent lower part (503) that lets indirect natural light (505) into the building. In this example, the rotating roofs (500, 501) are not used to create spaces one can inhabit, they only replace some parts of the flat roof. Some of them may only be mere rotating systems without any roofing function. Their motion can be coordinated or not. It can follow the sun (506) or not.

FIG. 6A-C

Figure 8A:
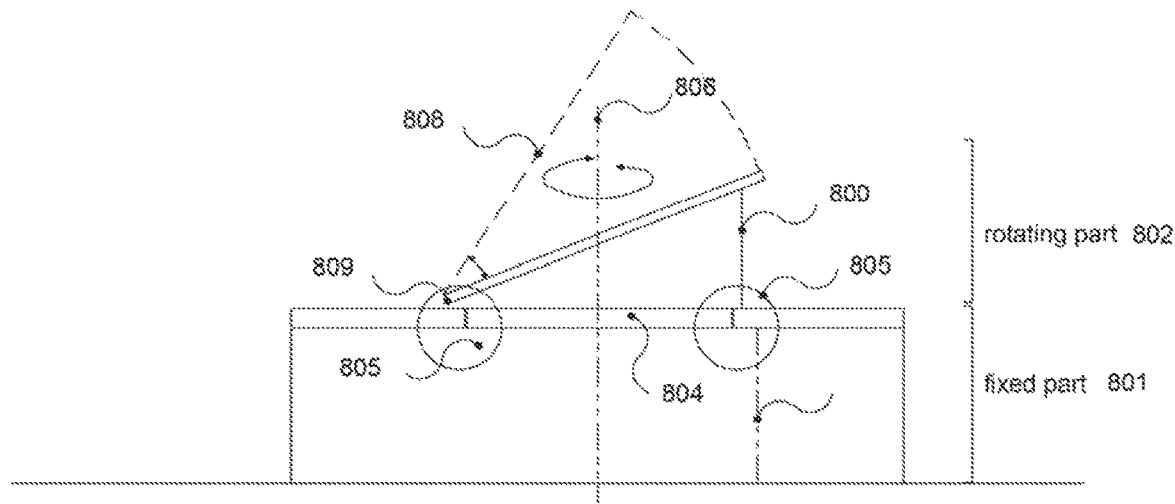
FIG. 8A illustrates a side view of a rotating roof with a secondary movement of the mobile part of the rotating roof, according to certain embodiments.

Rotating roof principles: Examples of use for sun/light/views. The 5 schemes of FIG. 6A show an example of rotation of a roof (600) following the sun path. The roof would be facing East at dawn and progressively turning its way through facing West in the evening. As non-limiting examples, one use the configuration of FIG. 1 or 8, in which the sun facing skin is opaque and the opposite face is translucent.

In other cases of application, the rotation capability can be used for any other purpose other than the tracking the sun (605). The single arrow (601) of each scheme indicates the downward slope (or, in other words, the opaque panels facing the sun or sun-facing skin of the building) and the group of two parallel arrows (602) indicates the indirect natural light flowing into the building. Similarly, views are possible through the non-opaque skin. The view can change with the rotation. The scheme on FIG. 6B shows a section view of this principle, with a fixed part (603) below a rotating one (604).

The scheme shown in FIG. 6C is about technical connections: if a connection (for example wires, ducts etc) is needed between the fixed (603) and the mobile parts (604), a good solution is to use the only fixed point of the moving geometry: the center of the rotation. Therefore, special axial connection components (608) are created around this point and allow for ducts, pipes, wires or parts (609) belonging to the mobile part (610) to be connected to their immobile continuation network without excessive deformation. The immobile part can continue its way using any geometry (for example vertical, sloped or other) and connect to the classical parts of the building. This is particularly important if the mobile part is used for energy, or if it deals with airflows or information or any time a connection is needed between the mobile part and the fixed part.

FIG. 7A-C

Figure 7A:
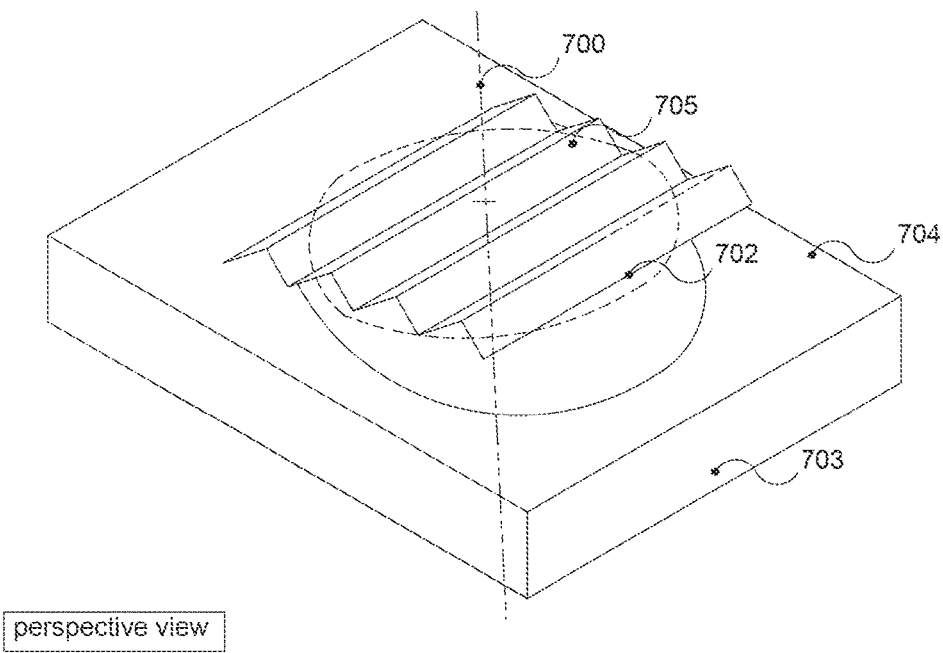
FIG. 7A illustrates a perspective view of a rotating roof with a non-vertical axis of rotation, according to certain embodiments.
Figure 7B:
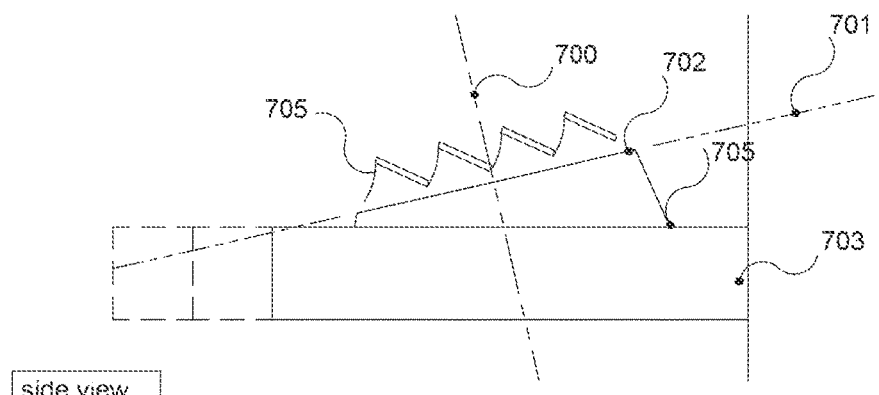
FIG. 7B illustrates a side view of a rotating roof with a non-vertical axis of rotation, according to certain embodiments.
Figure 7C:
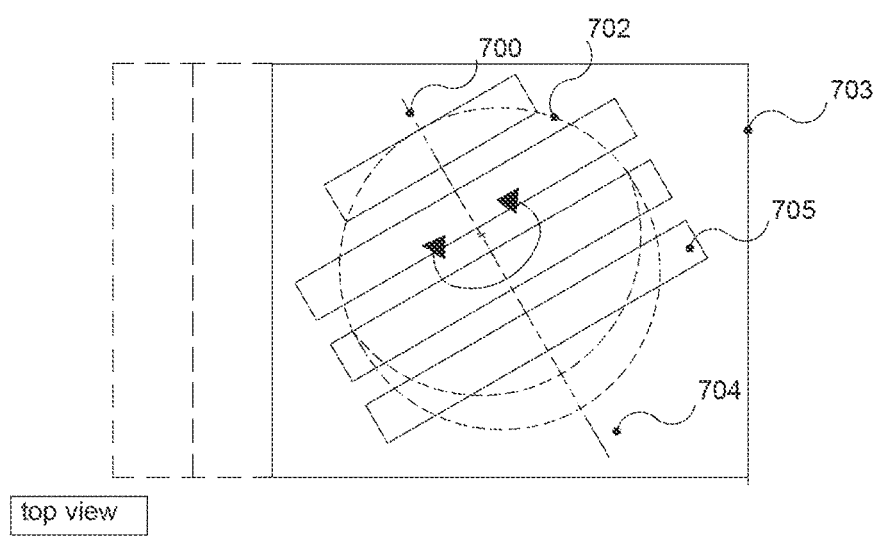
FIG. 7C illustrates a top view of a rotating roof with a non-vertical axis of rotation, according to certain embodiments.

FIG. 7A is a perspective view; FIG. 7B is a side view and FIG. 7C is a top view. These figures show that the axis of rotation (700) is not necessarily vertical. So, the plane of rotation (701), and the contact line (702) between mobile (705) and fixed parts (704) are not necessarily horizontal either. According to certain embodiments, the plane of rotation (701) does not have to be perpendicular to the axis of rotation (700): a different axis, or a non-plane "plane of rotation" can be used to create certain paths of motion. According to certain embodiments, the rotating part does have to be above the fixed part (704), the setting can be completely different. In this figure, it is noted that the rotating part (705) can have any shape or function or equipment, as well as any size or angle, and that the elements of the rotating part (705) can have their own autonomous motion, while the supporting structure (703) may also be capable of motion. The supporting part (703) can be any kind of structure, not necessarily a classical building. It can move too.

FIG. 8A-B

Figure 8B:
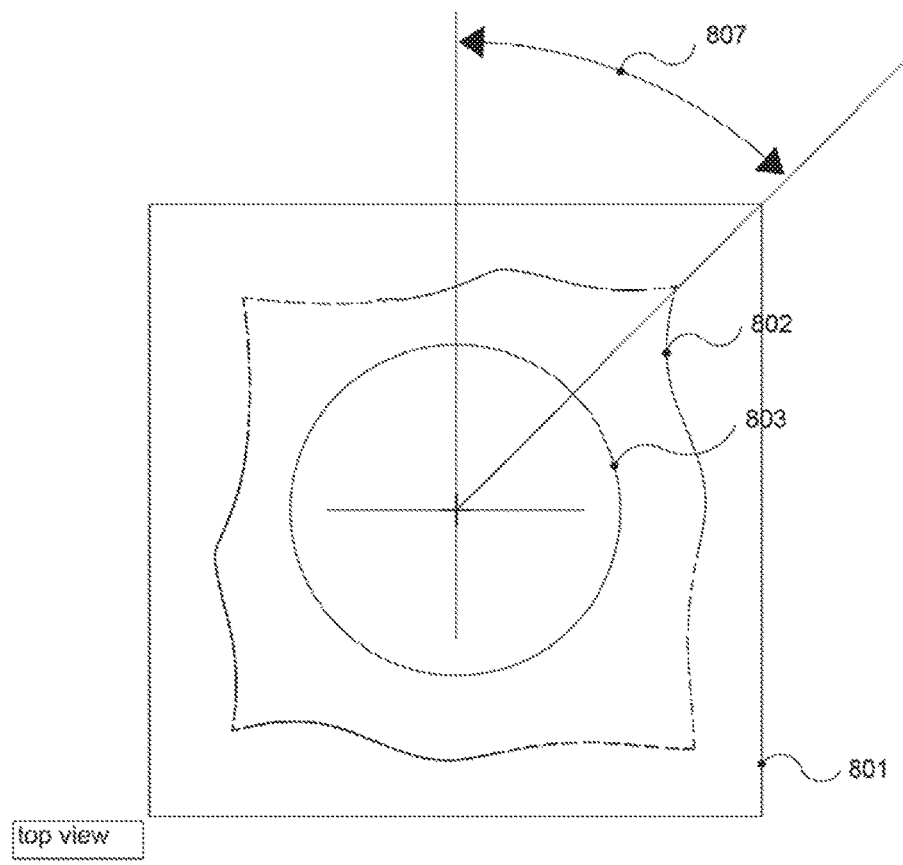
FIG. 8B illustrates a top view of a rotating roof with a secondary movement of the mobile part of the rotating roof, according to certain embodiments.

These figures show a schematic section view (FIG. 8A) and a top view (FIG. 8B). It shows another example of application, with a secondary movement of the mobile part (802). The top drawing is a section view that shows a lower fixed part (801) including a horizontal contact line (803) and the possibility of any type of supporting structure. It shows that the space inside the rotating part is not necessarily open to the volumes of the lower part, according to certain embodiments: separations (804) can be created, either parallel to the plane of rotation or otherwise. If a sealed volume is desired (closure against the outside), then the sealing (805) has to take place around the point of contact. The section view also shows an example of a roof that has a second axis of rotation: while it is rotating around a vertical axis (806), it can also rotate around a horizontal axis (809) parallel to its rotation plane (in this case, but any other axis or movement is possible), thus allowing various slopes (808) for a better tracking of the sun, or a better light penetration, a higher volume, a better visibility or any other factor. If the building is a sealed one, then the closure has to be achieved in any of the possible positions of the moving part. This means that the distance between the contact line (where the rotational sealing is performed) and the lower part of the changing slope may change. This is solved in two possible ways: either the closure skin (800) is extensible or flexible, or if it is rigid, it has to slide into the fixed part when the top is down while the sealing is still achieved. Some of the sealing solutions proposed below are able to deal with such requirements. FIG. 8B is a top view that shows that any kind of fixed structure can support any kind of mobile part. Whatever the rotation amplitude (807), if the building is sealed or closed, the sealing has to be made on the 360 degrees of the contact line (803).

FIG. 9A-C

Figure 9A:
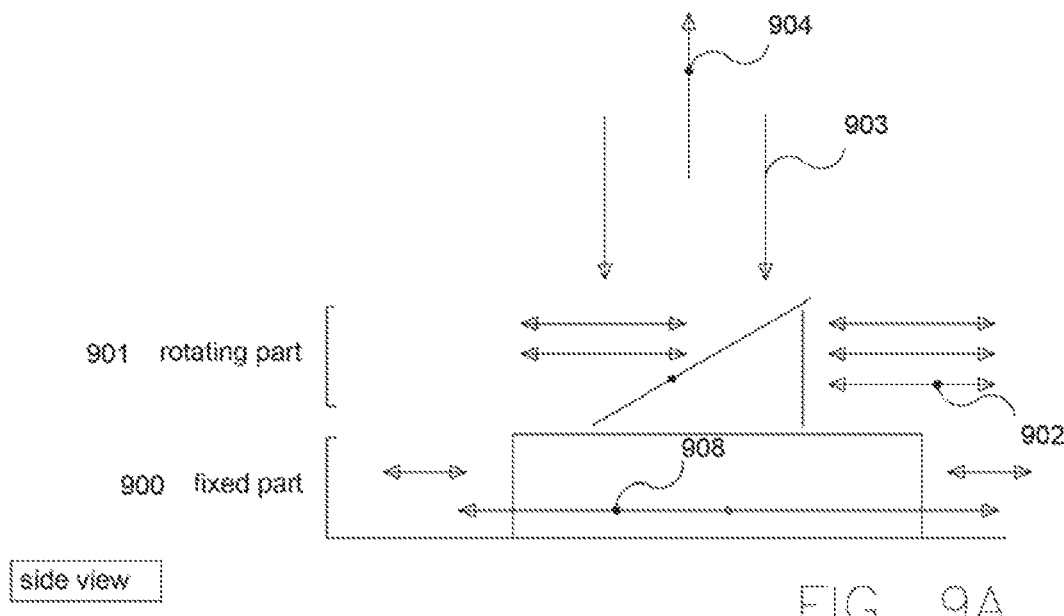
FIG. 9A illustrates a side view of the force loads and sealing requirements of a rotating roof, according to certain embodiments.
Figure 9B:
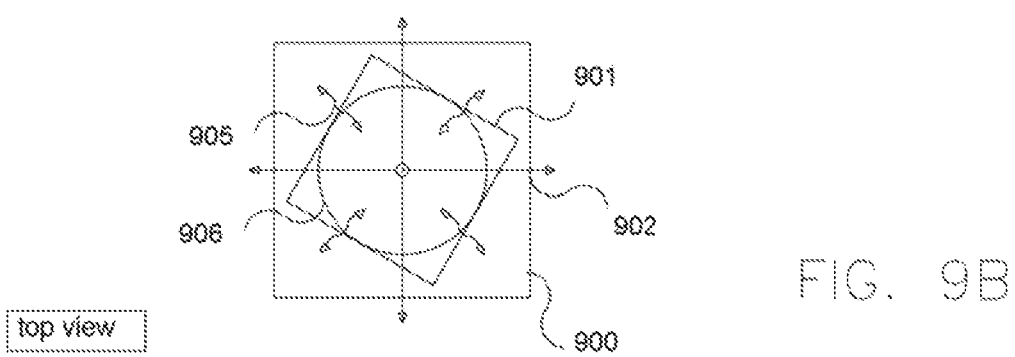
FIG. 9B illustrates a top view of the force loads and sealing requirements of a rotating roof, according to certain embodiments.
Figure 9C:
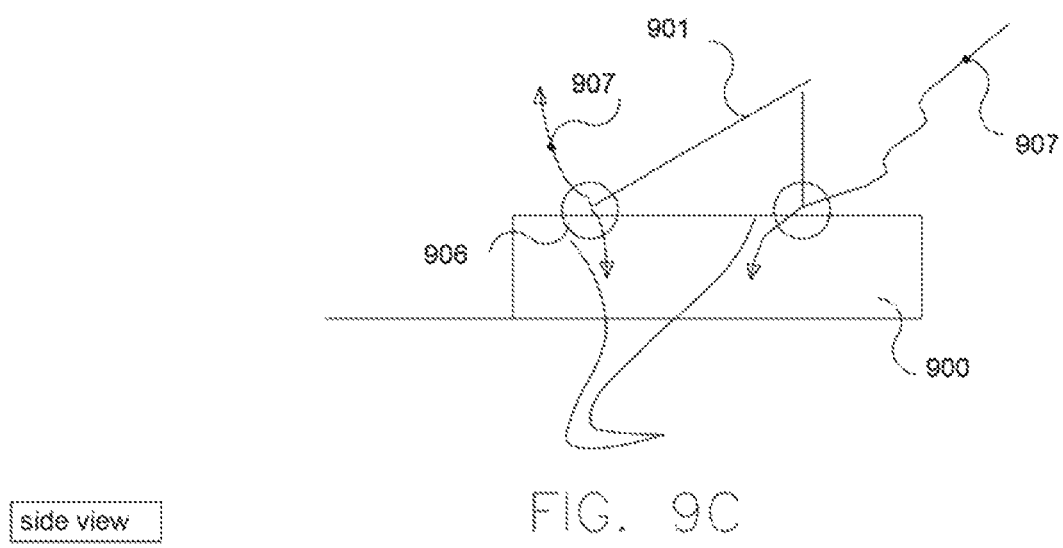
FIG. 9C illustrates another side view of sealing requirements of a rotating roof, according to certain embodiments.

These figures illustrate the loads and sealing requirements of the structure, according to certain embodiments. FIG. 9A is a side view. It shows a lower fixed part 900 (fixed only in the sense it is non-rotating) which can be moving, either because it is set in motion or because of wind, of seismic movements, or otherwise. This lower part (900) is also affected by horizontal loads (908) such as wind. The upper rotating part can be affected by loads such as horizontal seismic or wind loads (902), with vertical downward loads (903) such a snow weight, or vertical upward loads (904) such as wind suction (wind loads can also be chaotic). FIG. 9B is a top view. It shows a given rotating part (901) and a given fixed part (900), at any angle of their rotation. The straight arrows (902) schematize the horizontal loads and the twisted arrows (905) schematize the penetration/sealing issues all around the contact line (908). FIG. 9C is another side view of the same case of application. If the fixed building (900) and the rotating set (901) can each easily be sealed, the rotating connection between them is another story. The twisted arrows (907) schematize the locations (906) of inward or outward risks of passage of rain, wind, dust, sand, gases, moisture, air, etc. Solutions to this crucial problem are described below.

FIG. 10A-B

Figure 10A:
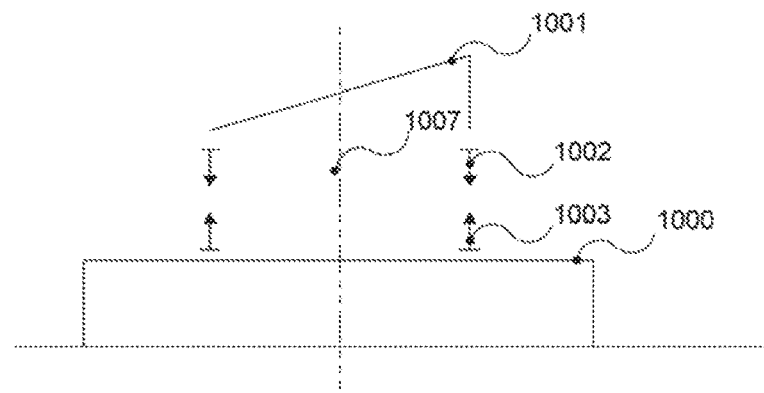
FIG. 10A illustrates a side view of a magnetic levitation of the rotating part of a rotating roof, according to certain embodiments.
Figure 10B:
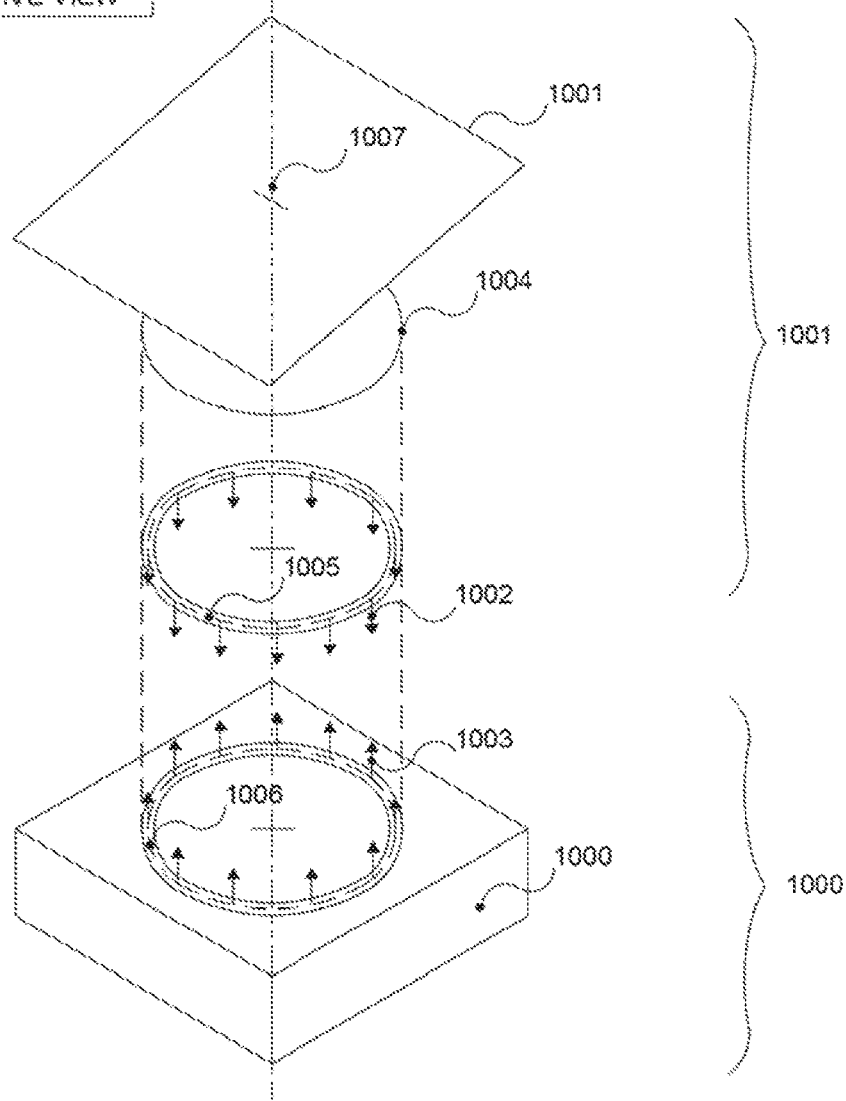
FIG. 10B illustrates a perspective view of a magnetic levitation of the rotating part of a rotating roof, according to certain embodiments.

If the upper part (1001) of the building fixed part (1000) is going to rotate, it has to be supported. There are several solutions, some of them more adapted to specific cases. The designer can choose the appropriate solution after reviewing the project's requirements. These figures summarize the principle of a magnetic levitation of the rotating part (1001). FIG. 10A is a side view. It shows an upper rotating part (1001) pushed above a fixed part (1000) by opposed magnetic forces (1002, 1003) applied around the contact line (1004). FIG. 10B is an exploded perspective view showing a fixed part (1000), a rotating part (1001) and, between them, two sets of magnetic supports (1005, 1006) generating opposed forces (1002, 1003) around a fixed and a rotating circle centered on the axis of rotation (1007).

FIG. 11A-B

Figure 11A:
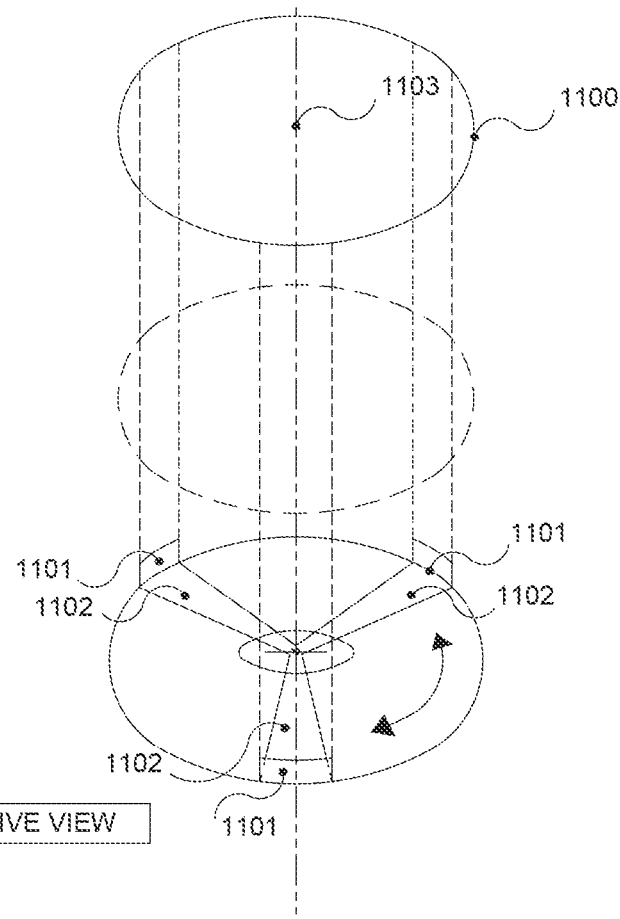
FIG. 11A illustrates a perspective view of radial control of a rotating roof, according to certain embodiments.
Figure 11B:
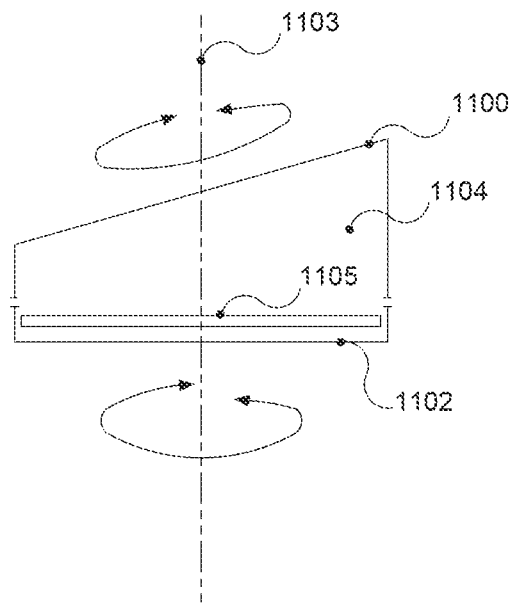
FIG. 11B illustrates a side view of radial control of a rotating roof, according to certain embodiments.

Since one part has to be moving separately, it has to be, at some degree, independent from the fixed part. The problem is that the rotating part (1100) of the building needs to be controlled and bound to the supporting structure. As was seen in a previous figure, there are strong external forces and lateral control is one of the problems. These figures show an exploded perspective view (FIG. 11A) and a section view (FIG. 11B) that describe one of the solutions: radial control. Several points (1101) of a peripheral circle attached to the rotating part (1100) (favorably the contact circle) are attached through radiating guiding arms (1102) to a structure point located at this axis of rotation (1103), and they rotate to provide lateral control like in a giant wheel. If these rotating guiding arms (1102) interfere with the usage of the volume (1104) (for example if they are located at the level of the ground) an optional internal flooring (1105) can be installed. Optionally, these guiding arms (1102) can be motorized and rotate the mobile structure (1100).

FIG. 12A-C

Figure 12A:
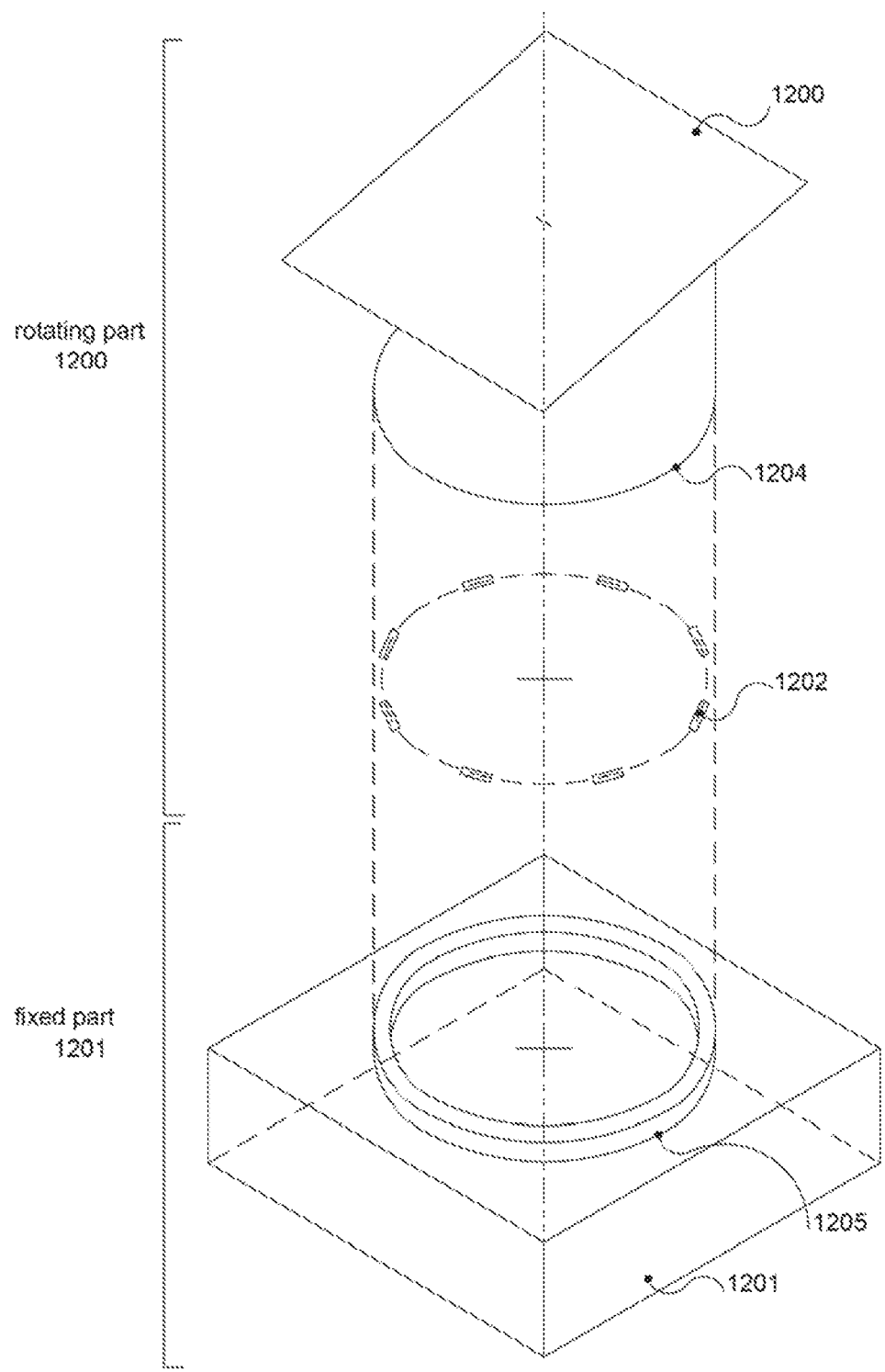
FIG. 12A illustrates a perspective view of a rotating roof with a circular rail and wheel system, according to certain embodiments.
Figure 12:
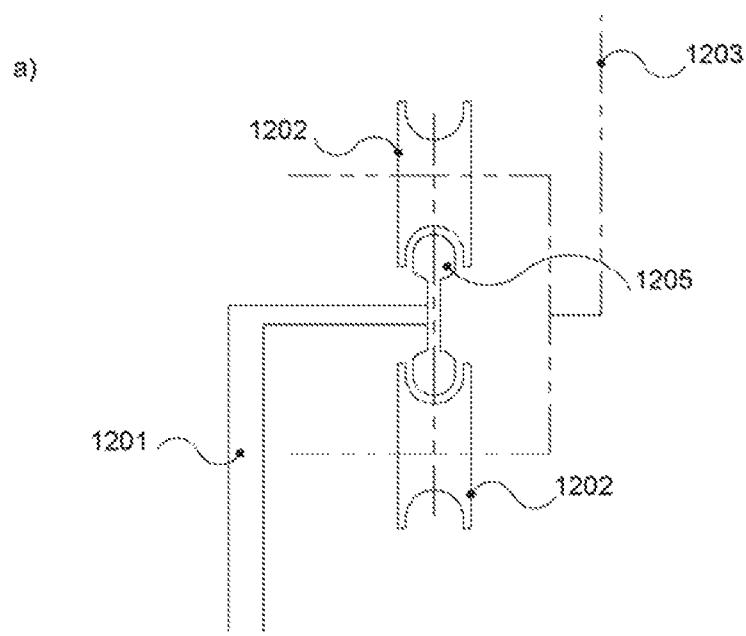
FIG. 12B illustrates a double facing supporting rail system for a rotating roof, according to certain embodiments.
FIG. 12C illustrates rolling system for a rotating roof, according to certain embodiments.
Figure 12C:
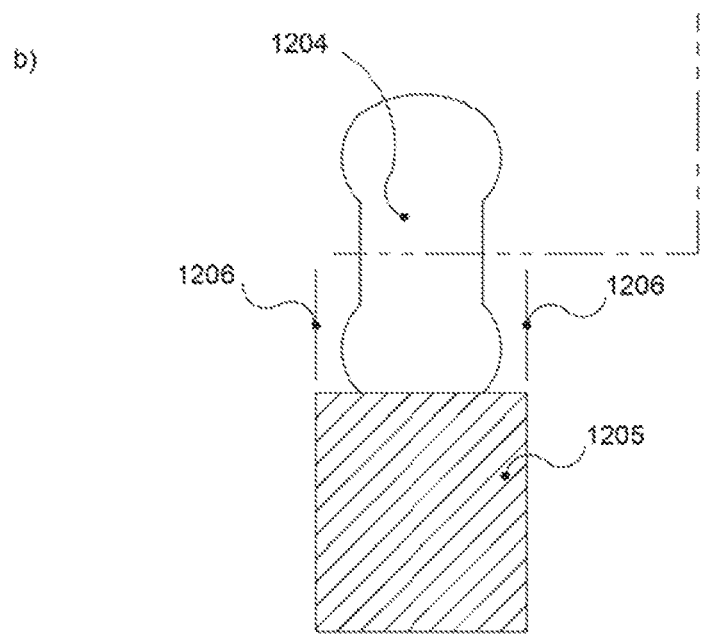

These figures show several other solutions for supporting and controlling the rotating part (1200). FIG. 12A is an exploded perspective view. It shows a fixed part (1201) bearing a circular rail (1205), on which roll the wheel systems (1202) attached to a similar upper circular rotating structure (1204), which itself supports the whole rotating part (1200). FIG. 12B shows a supporting system made of a double facing supporting rail (1205) attached laterally (1201) and two connected railway style wheels (1202): one above the rail (1205) is transmitting mainly the weight of the mobile part (1203) to the supporting rail (1205). The other one, below the rail (1205), is preventing the mobile part from lifting due to vertical forces such as wind. FIG. 12C shows another solution of rolling system: an automobile style wheel+tire is rolling (1204) on a track (1205). Optionally lateral guides (1206) help control the movement laterally. The tire system is less well guided but probably more silent than the railway-like system.

FIG. 13A-B

Figure 13A:
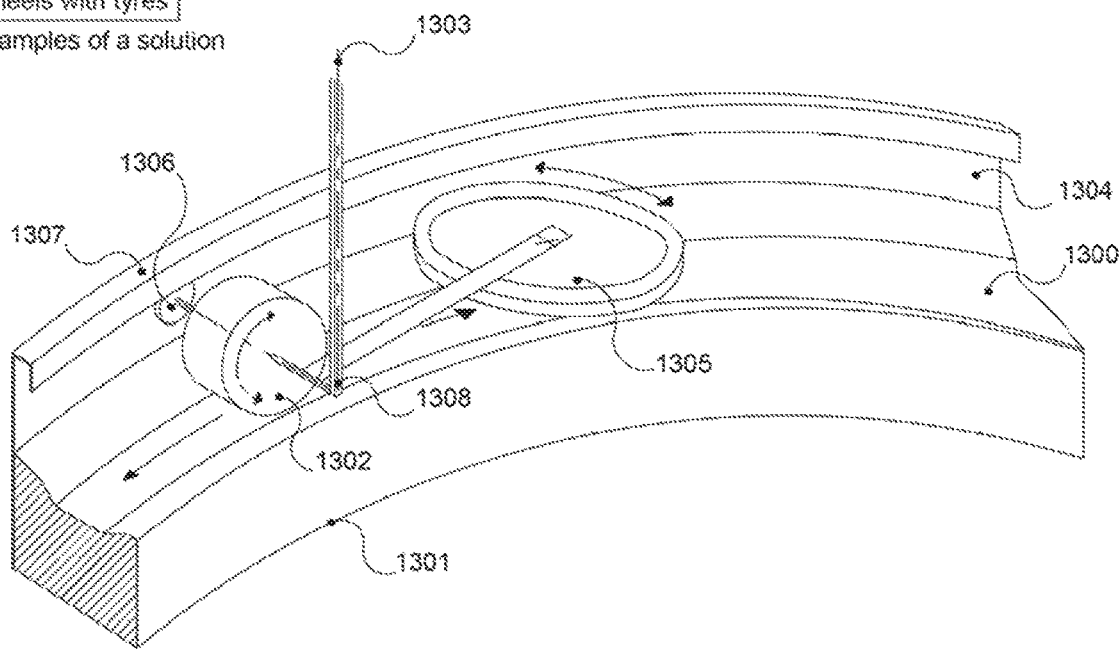
FIG. 13A illustrates a perspective view of a portion of the rolling track for a rotating roof, according to certain embodiments.
Figure 13B:
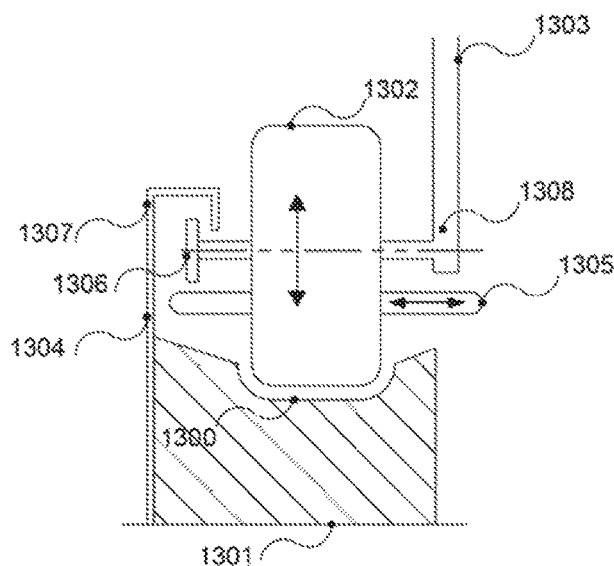
FIG. 13B illustrates a side view of an anti-lifting wheel in the anti-lifting rail for a rotating roof, according to certain embodiments.

FIGS. 13A-B deal with the wheel+tire solution and describes solutions for lateral and vertical control. FIG. 13A is a perspective view of a portion of the rolling track (1301). It shows two circular tracks: one, horizontal (1300), is used by a main vertical supporting wheel (1302) that holds the weight of the rotating structure (1303). The second one is a vertical track (1304) that circles around the previous one to provide support to a horizontal lateral control wheel (1305) aiming at preventing the whole rotating part to run out of its trajectory (derail). FIG. 13B is a section view. This section view clearly shows the anti-lifting wheel (1306) in the anti-lifting rail (1307). It also shows an optional suspension system (1308). According to certain embodiments, such wheel systems can be installed several times all around the circle, in order to provide stability. Optionally, the wheel system includes a suspension (1308). Another component is the anti lifting system: a smaller wheel or rod runs under another horizontal circular rail (1307), which blocks any upward movement, thus ensuring that the rotating part (1303) stays in place vertically. Additionally, a blocking system (1305) permits to lock into immobility the whole building: a simple rod/blocking system (1305), attached to the wheel system or to any part of the rotating part, is pushed into one of the locking holes (1304) that occur in various places in one of the control rails (1307). This security system totally stops any possibility of rotation. The calculus and dimensioning is to be done by the expert with specific project's data.

FIG. 14A-D

Figure 14A:
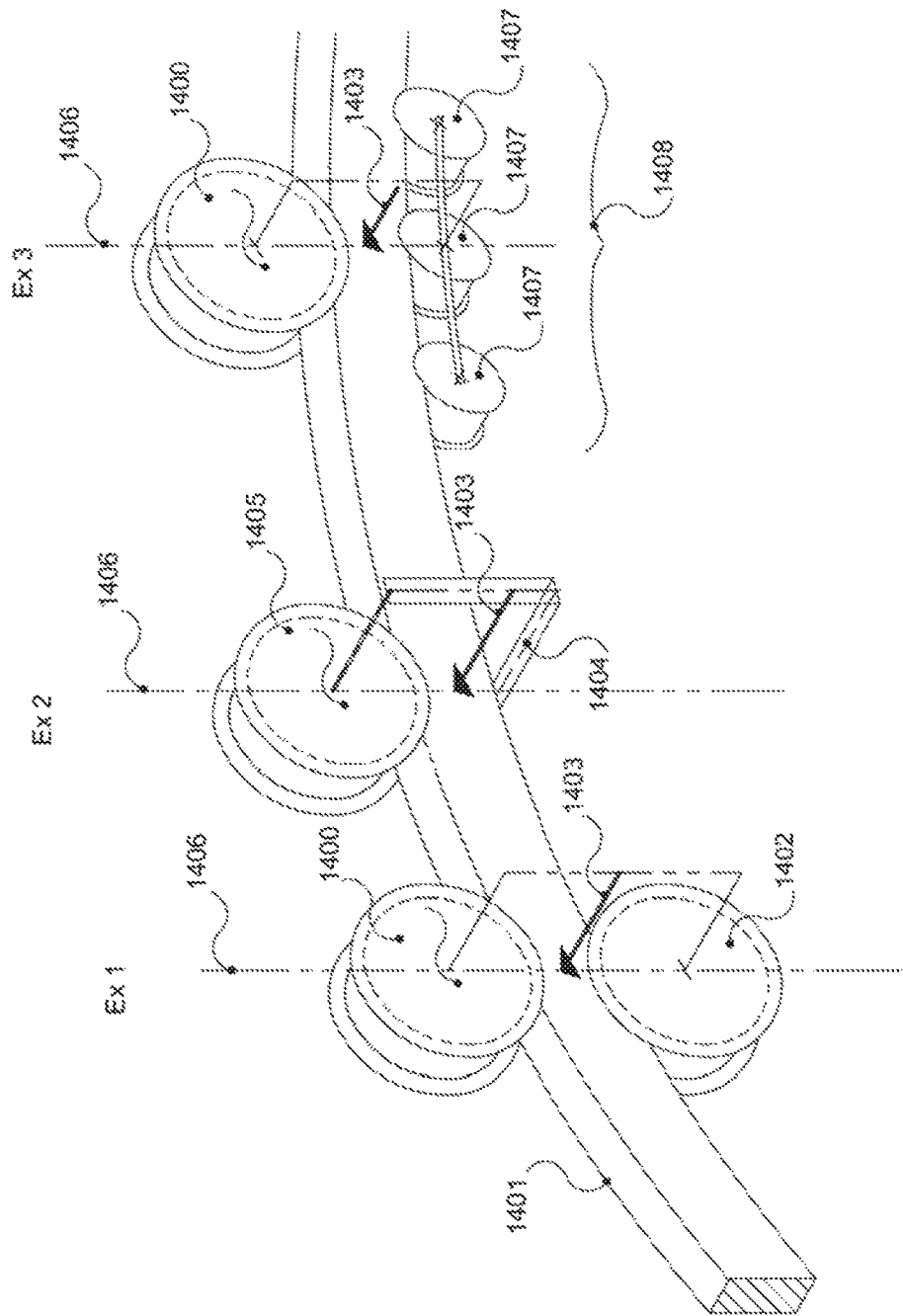
FIGS. 14A-D illustrate rigid wheel systems for a rotating roof, according to certain embodiments.

FIGS. 14A-D show three examples of solutions with wheel systems. These rigid wheel systems require no additional lateral control systems (this control is provided by the wheel and the rails), nor anti lift system, according to certain embodiments. They may include suspension systems (1409). FIG. 14A is a perspective view that shows the three examples of wheel systems supporting the upper rotating part (1406) and drafted on the same fixed rail (1401). All cases involving wheels (1400) may include motorized wheels as well as brakes (braking system). In Ex1, the system comprises a wheel (1400) above the rail (1401) and a wheel (1402) below it, plus a locking system (1403). In Ex2, the lower wheel is replaced with an anti lifting part (1404), made of a component, attached to the upper wheel (1405) and sliding under the rail (1401) to prevent any upward movement. In Ex3, the lower wheel is replaced with an anti lifting wheels system (1408), made if one or several smaller wheels (1407) and providing the same anti lifting safety and locking system (1403).

Figure 14B:
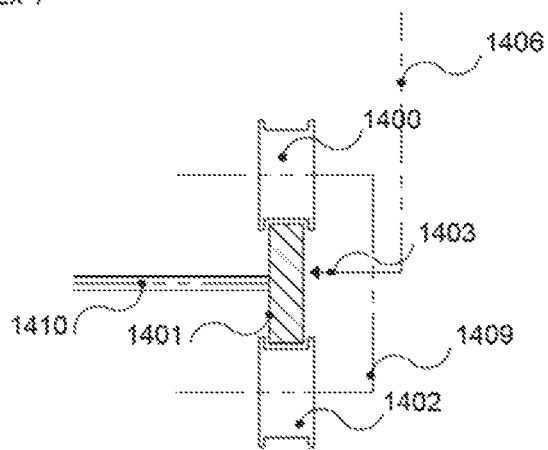
Figure 14C:
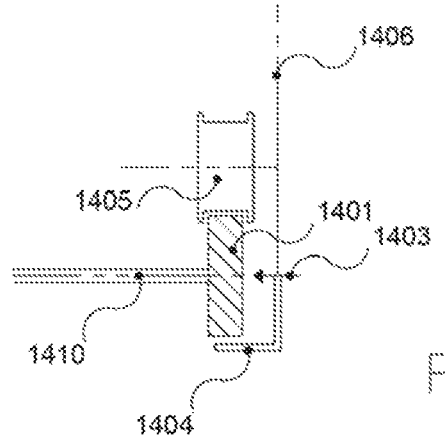
Figure 14D:
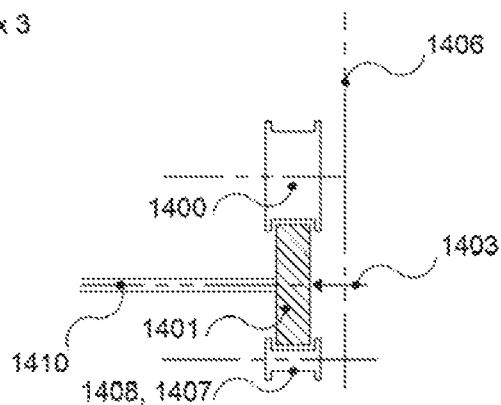

FIG. 14B, 14C, 14D shows three schematic sections corresponding to Ex 1, Ex 2 and Ex 3 of FIG. 14A. These schematic sections show the blocking system and the types of anti-lift systems as described above.

FIG. 15A-D

Figure 15A:
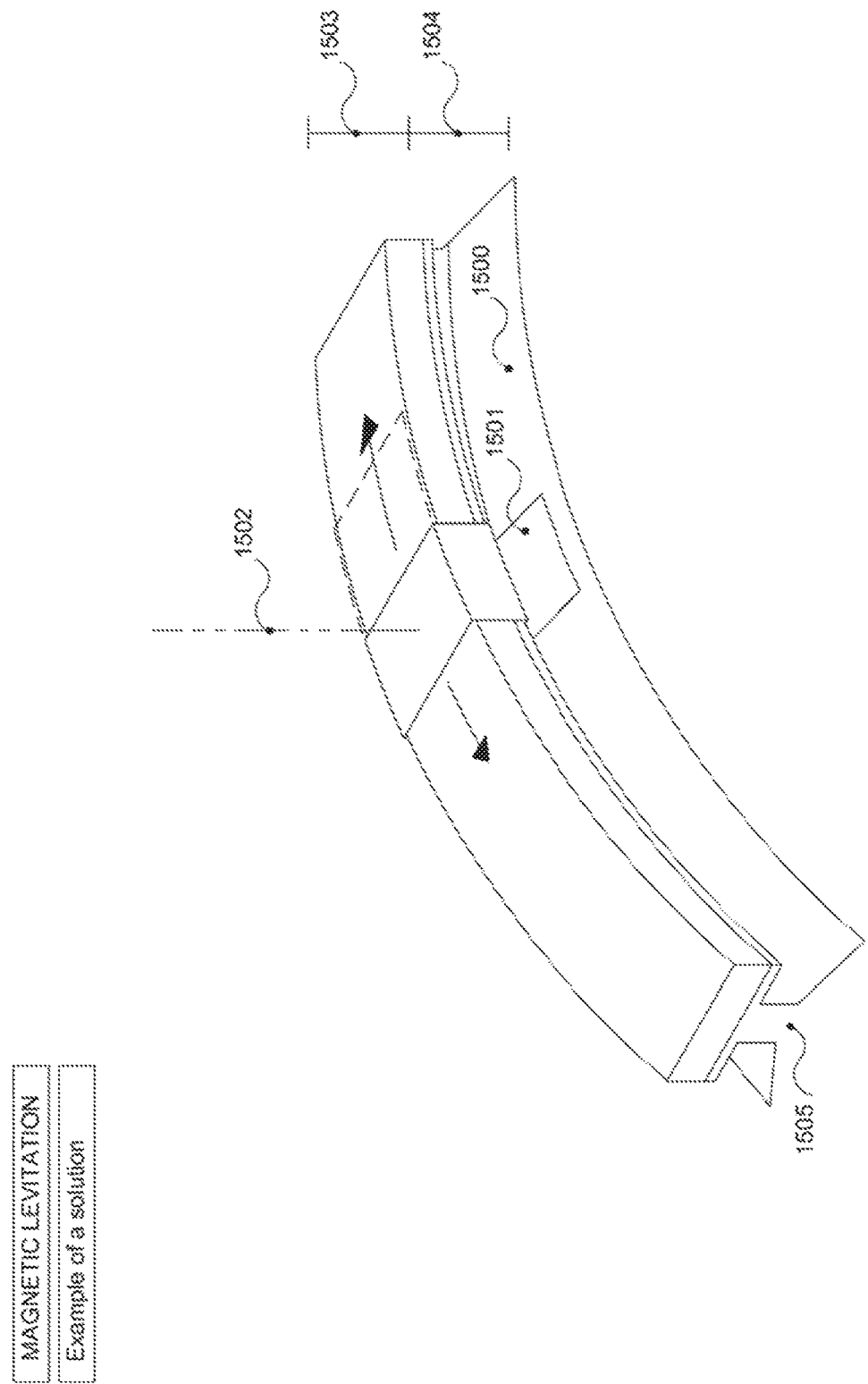
FIG. 15A illustrates a magnetic levitation system for a rotating roof, according to certain embodiments.

These figures describes an example of a magnetic levitation system. FIG. 15A is a perspective view of a part of the supporting rail showing the fixed part (1500) and the rotating part (1501) sliding on it, and connected to the rotating structure (1502). A linear motor system may be included. The supporting and guiding rail comprises two parts: a magnetic part (1503) and a mechanical one (1504).

Magnetic part: A system of opposed magnetic forces (1506) is created on a circle. The fixed magnetic layer sits on a rail all around the circle. Attached to the upper rotating part are a certain number of magnetic supporting points. They generate an opposed force, which pushes the moving part a few millimeters away from the fixed part. The lateral control is provided by the fact that both the fixed (1501) and the moving parts (1500) provide not only a vertical force but centrifugal and centripetal forces. The fixed part is shaped as a circular rail and the moving part as an upside down U that fits around the fixed rail thus providing mechanical lateral control.

Mechanical part: Two questions are solved here, 1) anti-lift and 2) auto centering (whatever the external forces, one may want the rotating part to come back to a centered position).

Figures 15B, 15C:
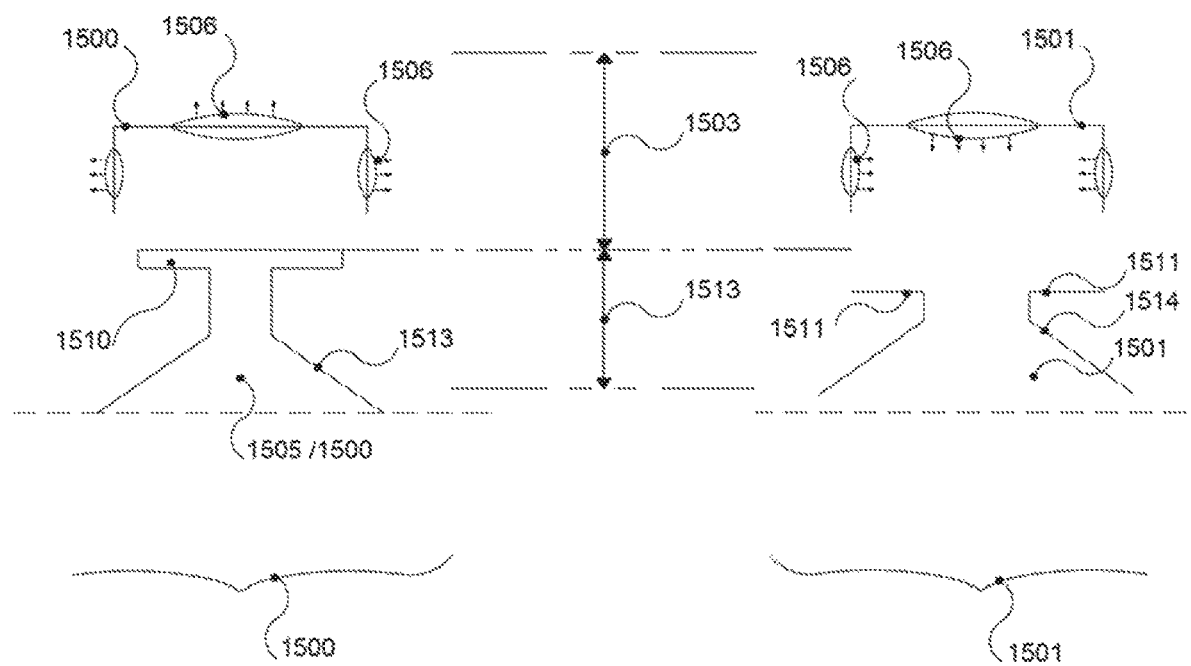
FIG. 15B illustrates the fixed part and the fixed supporting rail in a magnetic levitation system for a rotating roof, according to certain embodiments.
FIG. 15C illustrates the rotating part and rotating counterpart in a magnetic levitation system for a rotating roof, according to certain embodiments.
Figure 15D:
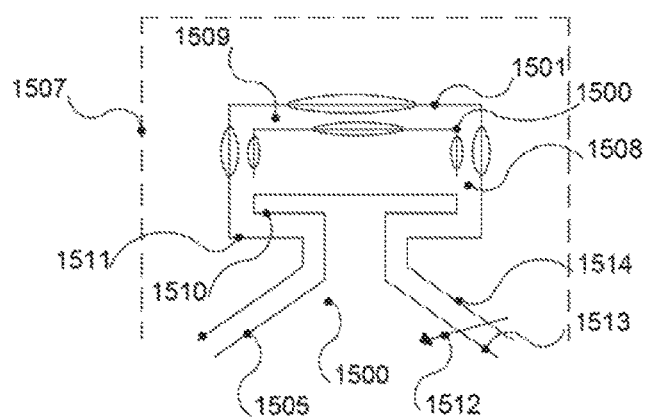
FIG. 15D illustrates the combined schemes of FIG. 15B and FIG. 15C, according to certain embodiments.

An additional rail+slider system is created. The lower part (1505) of the fixed circular rail, below the magnetic system, is shaped as a reversed V (1513), and so is the lower part (1514) of the mobile sliding part (1501). This rail also comprises an anti lifting system. FIG. 15B shows the fixed part (1500) and the fixed supporting rail, including the magnetic part that provides the lifting+lateral positioning forces, and the mechanical part that provides the anti lifting+lateral control+auto centering system. FIG. 15C shows the rotating part (1501) and rotating counterpart of the fixed supporting rail described in the preceding sentence, with the same features FIG. 15D shows the two middle drawings described in the preceding paragraph put together. It shows the fixed part (1500) and the mobile part (1501), the gaps for lateral play (1508) and for vertical play (1509), the anti lift fixed parts (1510) the anti lift moving part (1511) and the centering fixed parts (1513) mobile centering part (1514) parts as well as the blocking system (1512).

The magnetic levitation system works as follows: The vertical magnetic force lifts the rotating part a few millimeters. A linear motor system can be implemented. The lateral magnetic forces center the moving part above the rail. In case of wind or other external forces, the system cannot move very far: its shift is laterally and vertically limited by the centering and anti lift part on the rail. When magnetic lifting forces stop, the moving part sits down onto the rail and centers itself automatically on the circle's axis by pushing on the symmetrical sides of the reversed V rail. Calculus, dimensioning and specific design to be done by the expert in the field using the real project's data (1507).

FIG. 16A-D

These figures describe an example of a liquid levitation system. In some cases, instead of wheels or levitation, the rotating part (1600) may be supported by a liquid system. This has huge advantages: it is quiet and smooth, relatively inexpensive and well adapted to slow and regular motion. In some cases, it can be combined with the liquid sealing system as described below.

Figure 16A:
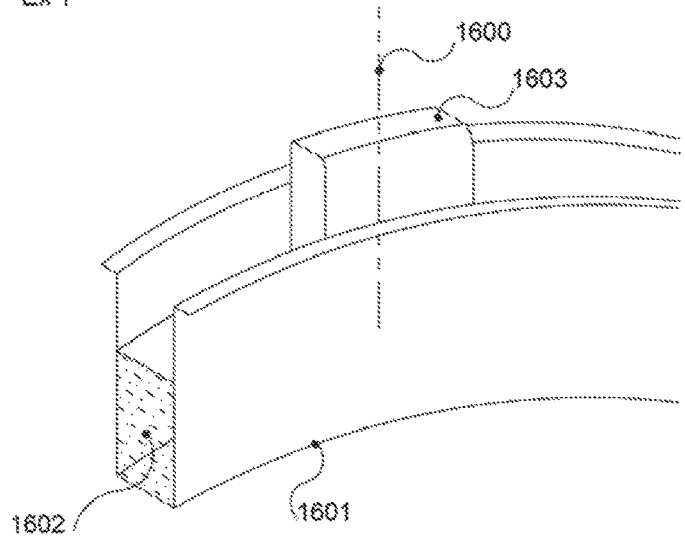
FIGS. 16A-D illustrate a liquid levitation system for a rotating roof, according to certain embodiments.
Figure 16B:
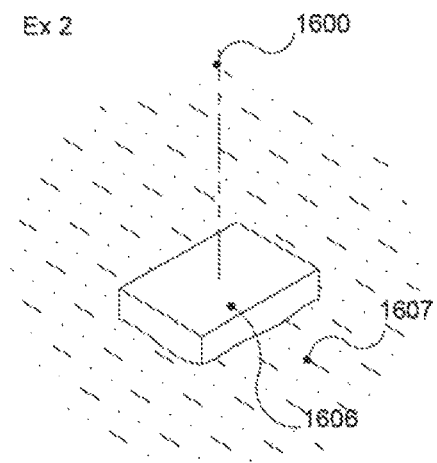
Figure 16C:
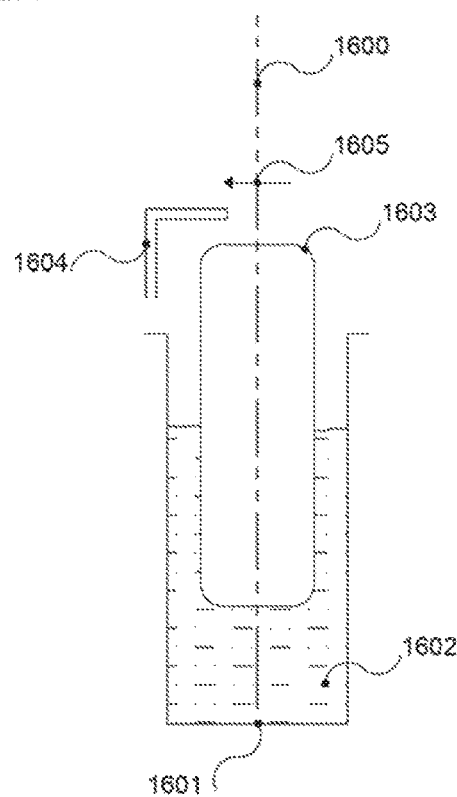

Ex1 in FIG. 16A and FIG. 16C shows a view of a part of a circular supporting system comprising a fixed circular canal (1601), which is filled with a liquid (1602), and a floating system (1603), which support the rotating part (1600) and slides along the canal. The set includes an anti lift system (1604) and a blocking system (1605), according to certain embodiments.

Figure 16D:
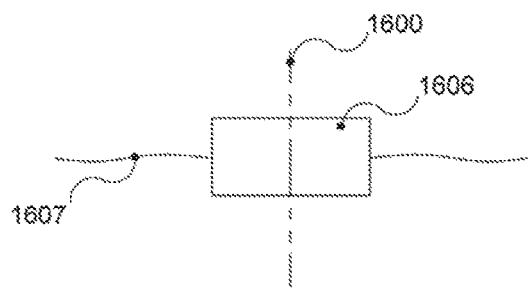

Ex2 in FIG. 16B and FIG. 16D shows a floating system (1606) connected to the moving part (1600) and based on a regular surface of water (1607), not a canal (therefore, if a rotational control is needed, it will be provided another way. In the case of Ex2, there is no circular control. Center axis guidance is needed.

FIGS. 17A-D

Propulsion: FIGS. 17A-D use similar perspective views to show several examples of propulsion systems than can be used to rotate the moving part.

Figure 17A:
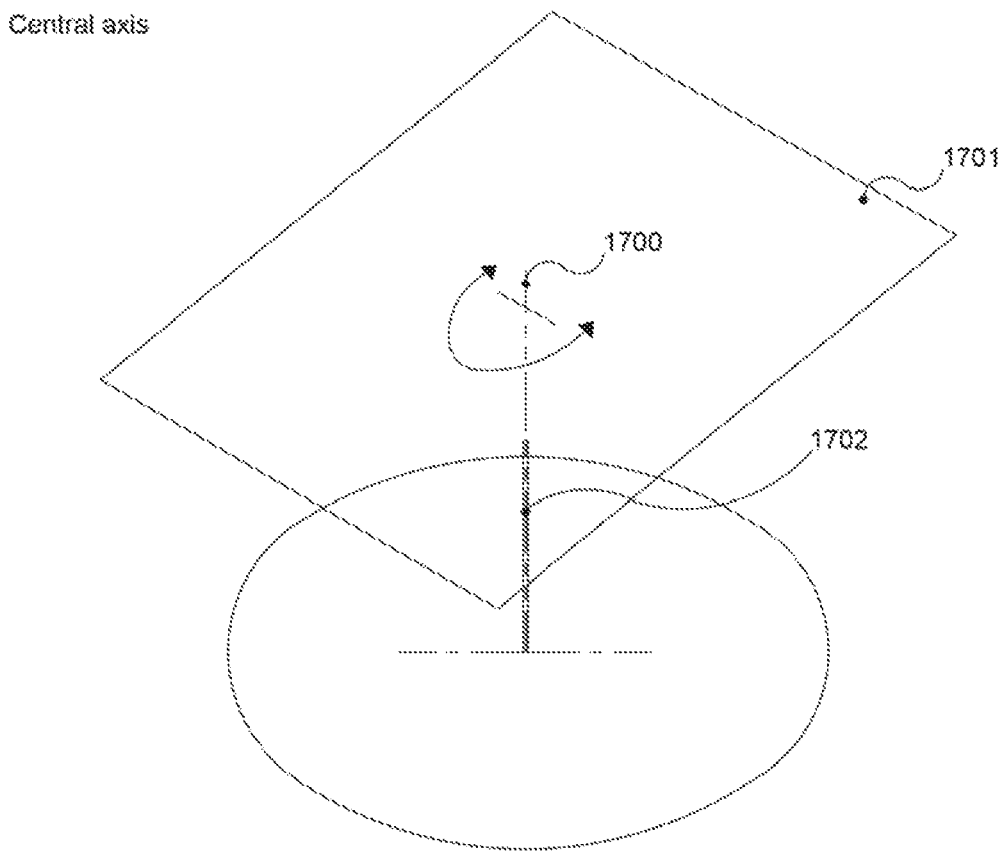
FIGS. 17A-D illustrates propulsion systems for a rotating roof, according to certain embodiments.
Figure 17B:
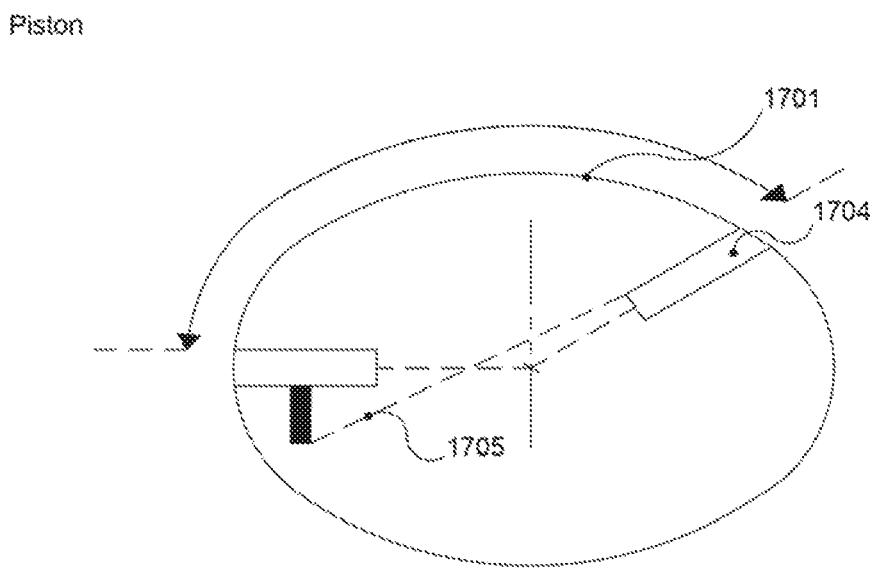

FIG. 17A: Central Axis

If there is an axial support (1700), the rotating part (1701) may rotate on a mast (1702) or a pole. This support may provide the propulsion; either by bearing a motor somewhere near the connection point with the rotating part or by having either a rotating mast or an additional transmission axis.

FIG. 17B: Piston

In this example, the rotating part (1701) has inward structures (1704), which may be pushed sideward by a piston (1705) such as an electric or hydraulic piston. This solution permits only limited amplitude rotation, thus creating the movement of rotation.

Figure 17C:
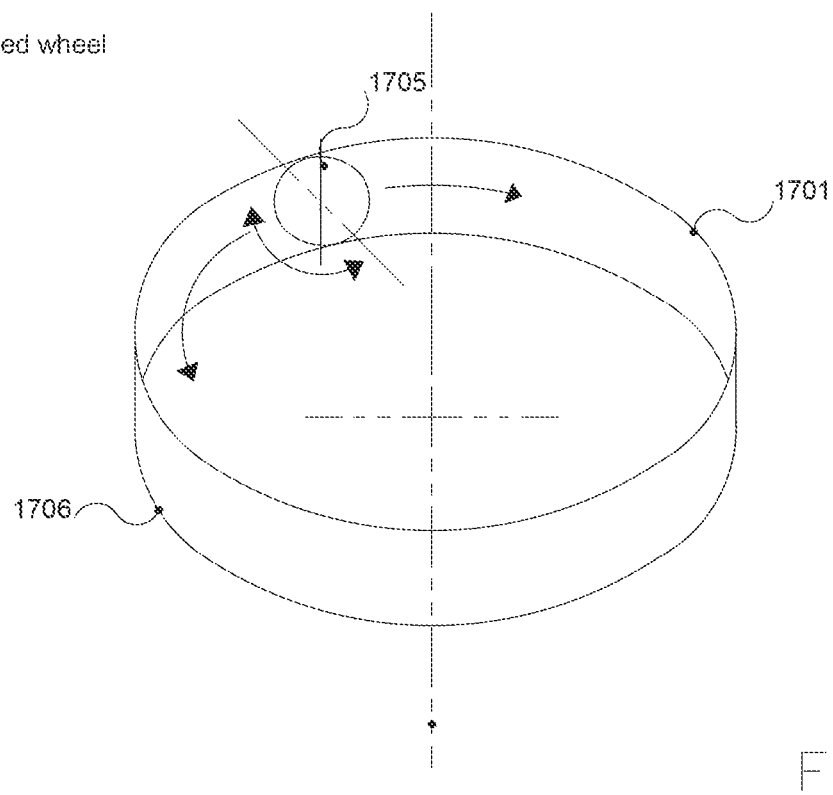

FIG. 17C: Motorized Wheel

This example is based on the systems that use supporting motorized wheels (1705) rolling on a circular track or rail (1706) to rotate the mobile part. One or several wheels (1705) can be motorized.

Figure 17D:
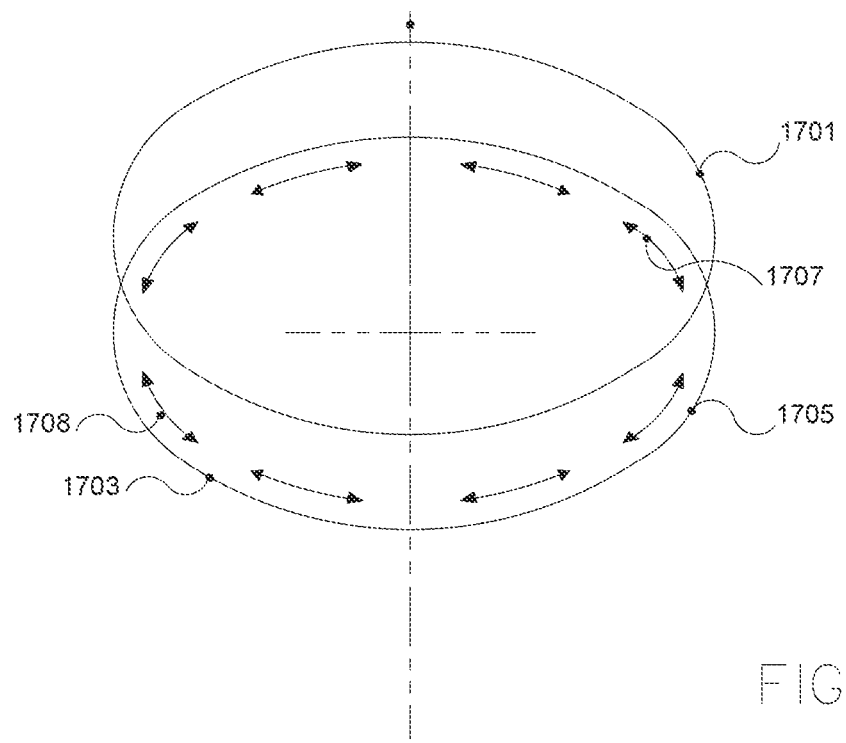

FIG. 17D: Linear Motor

The magnetic levitation system may be equipped with a linear propulsion system. A circular linear motor (1707) is created on the circle of contact (1708) between the fixed part (1703) and the rotating part (1701).

FIGS. 18A-D

In the case of liquid levitation, a canal (1800) is filled with incompressible liquid (1801) and floats (1802) that are connected to the rotating part (1804) move on the liquid. The motion can be created either by added propellers to the floats or by a pump (1803) creating a current in the liquid that will drag the floats and the rotating part.

Figure 18A:
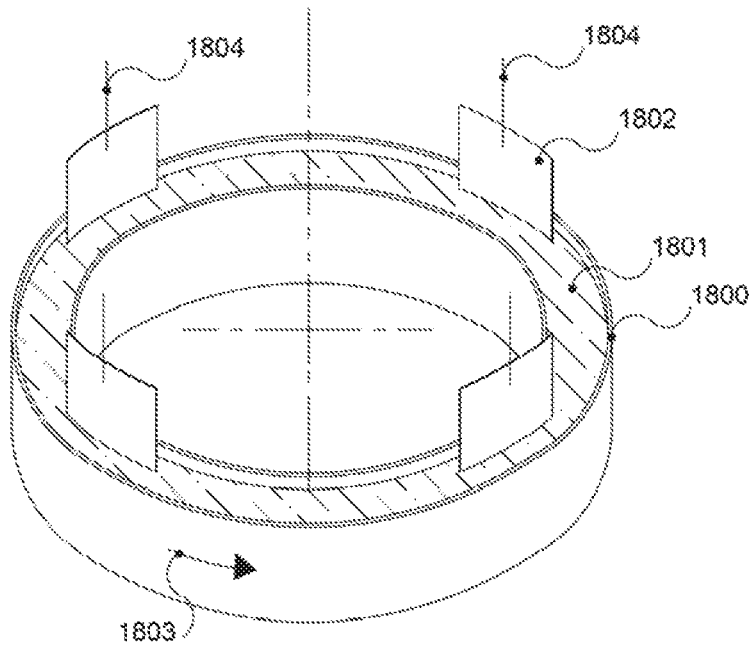
FIG. 18A illustrates a liquid levitation system where the motion can be created either by adding propellers to the floats or by a pump, according to certain embodiments.
Figure 18B:
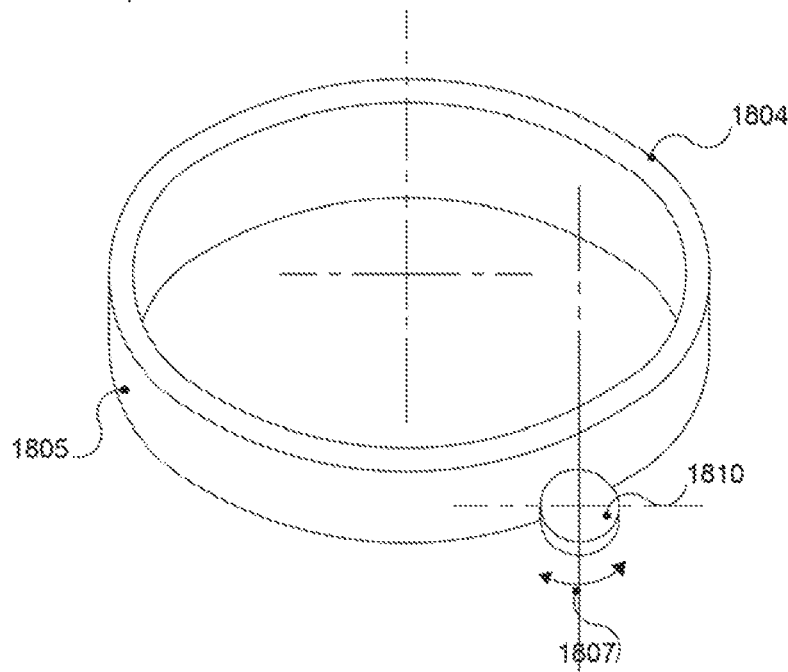
FIG. 18B illustrates a liquid levitation system with direct traction using a wheel, according to certain embodiments.

FIG. 18B: Direct Traction with a Wheel

In this example, the rotating part (1804) is encircled with a vertical rigid belt (1805) and a fixed motorized wheel (1810) rolling on a vertical axis (1807) rotates the belt, which is part of the rotating part.

Figure 18C:
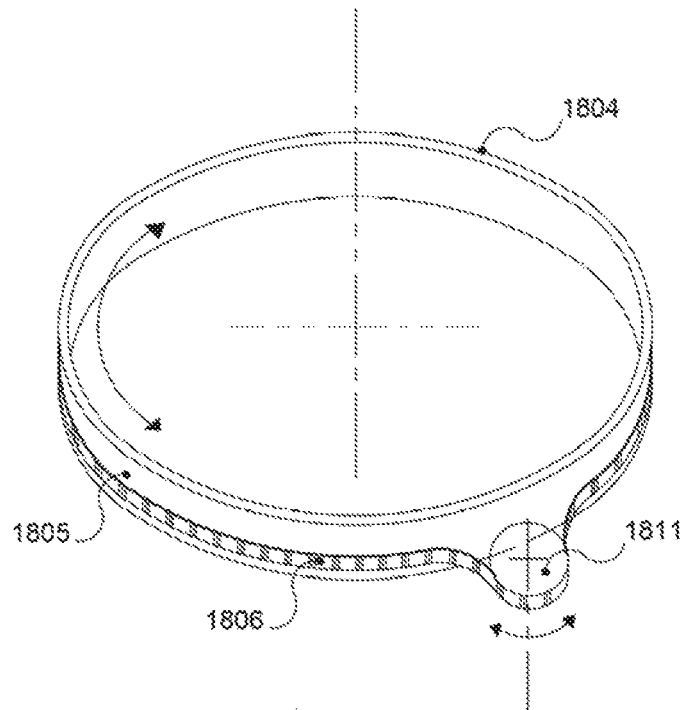
FIG. 18C illustrates a liquid levitation system with belt and chain system, according to certain embodiments.

FIG. 18C: Belt or Chain

In this example, the rotating part (1804) is encircled with a vertical rigid belt (1805) and a belt or a chain (1806) encircles the vertical rigid belt. A power wheel or pinion (1811) drags the belt (1806) or chain that encircles the vertical rigid belt (1805), thus rotating the mobile part (1804). The chain or the belt (1806) is tightened using a tension system.

Figure 18D:
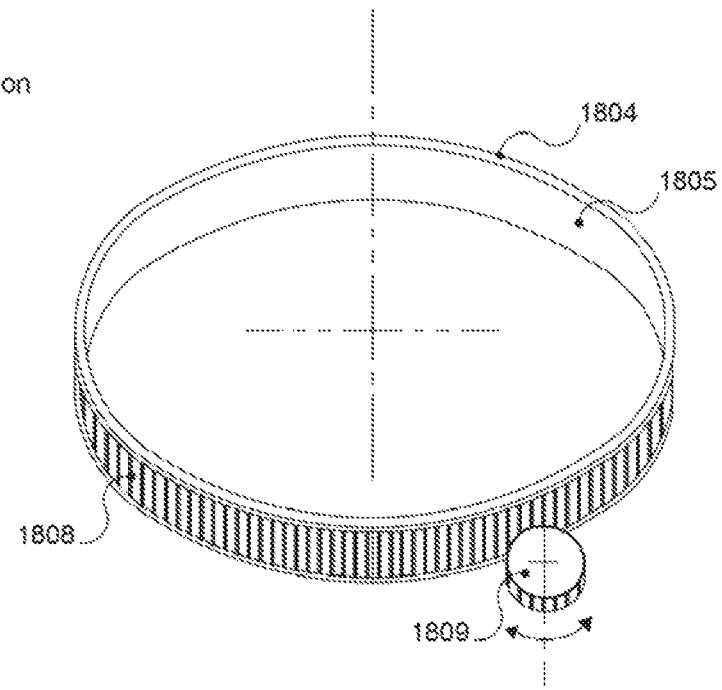
FIG. 18D illustrates a liquid levitation system with rack and pinion system, according to certain embodiments.

FIG. 18D: Rack and Pinion

In this example, the rotating part (1804) is encircled with a vertical rigid belt (1805) and bears a circular cog/rack or a fixed chain (1808). A fixed motorized pinion (1809) drags the circular cog/rack (1808) or a fixed chain, thus rotating the moving part (1804).

FIG. 19

Figure 19:
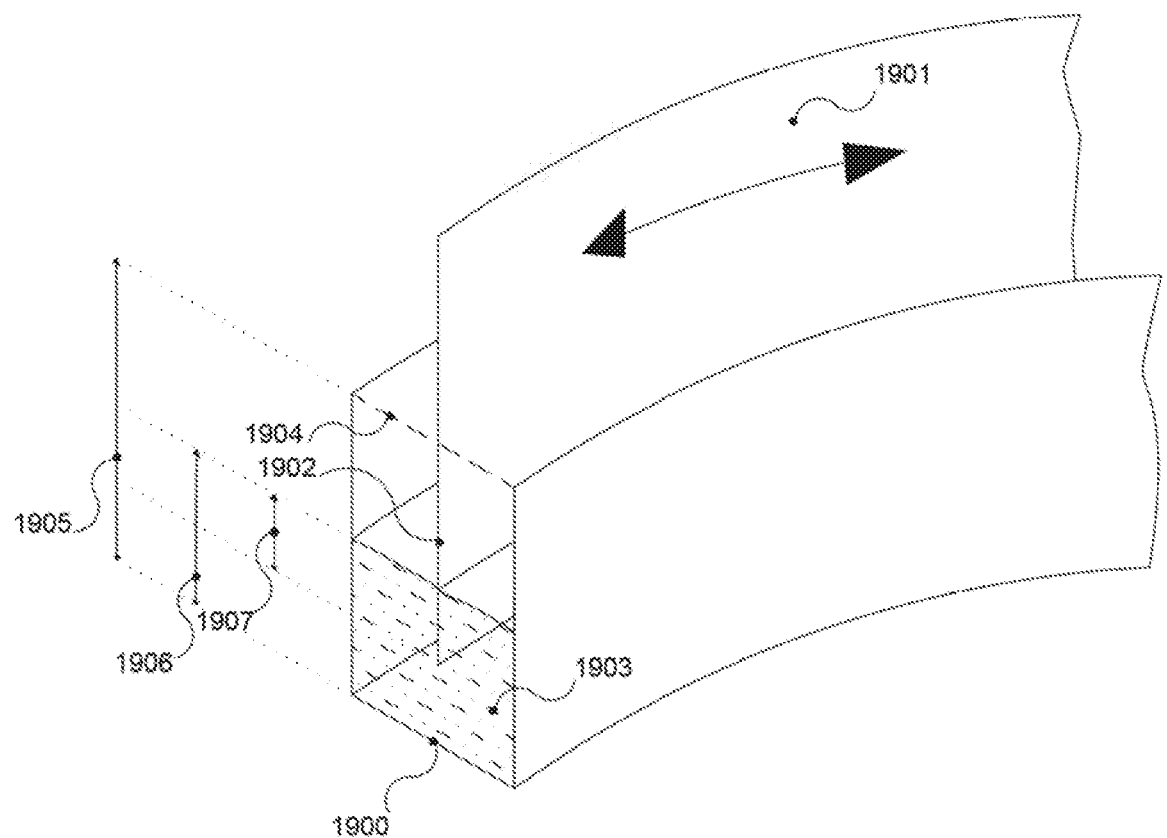
FIG. 19 illustrates a liquid sealing system for a rotating roof, according to certain embodiments.

Liquid sealing system: FIG. 19 shows a perspective view of a part of a circular liquid system. The water, oil or other liquids may form excellent barriers to air and gases and to heat, and dust, etc. A fixed circular canal (1900) is created around the rotating part (1901) that we would like to seal, and a circular "skirt" (1902) that is attached to the rotating part is immersed in the liquid (1903). The skirt (1902), since it is parrallel to the canal can rotate in the liquid (1903) effortlessly. The canal's sizing (1905) may vary depending on the project. The width or depth of the canal may vary, as well as the depth (1906) and properties of the liquid or the depth (1907) of the immersed skirt depending on the project. Optionally, the top face of the canal can be protected using a closure or a sealing system (1904). Choice of liquid depends on the project's requirements. Dimensioning and design is to be done by the expert according to the project's specifications. The system can be fitted with a liquid level gauge, with automatic filling or purge systems. Optionally, the liquid sealing solution can be combined with the liquid suspension system or with the liquid propulsion system. The portion of the skirt (1907) that is immersed in the liquid (1903) for sealing reason may also be made in such a way that it would be dragged by a current in the liquid (for example using paddles) and thus efficiently rotate the moving part.

FIGS. 20A-F

Liquid sealing system: FIGS. 20A-F show 3 examples of application of a liquid sealing system. Each example is presented through a section view and a perspective view. In the examples, the liquid sealing is achieved using one or two (as shown in the drawings) canals (2000, 2009) that run parallel to the rail (2001) or the rolling track (2001). One canal may be outside (2002) the circle of the rolling track and the other canal inside (2003). Having 2 canals allows for better insulation and for protecting the mechanism against dirt. A circular component, here called "skirt" (2004), is attached to the rotating part (2005) and is immersed in the liquid (2006), thus sealing the system. It moves with the rotating part, and is continuously sliding in the liquid.

Figure 20A:
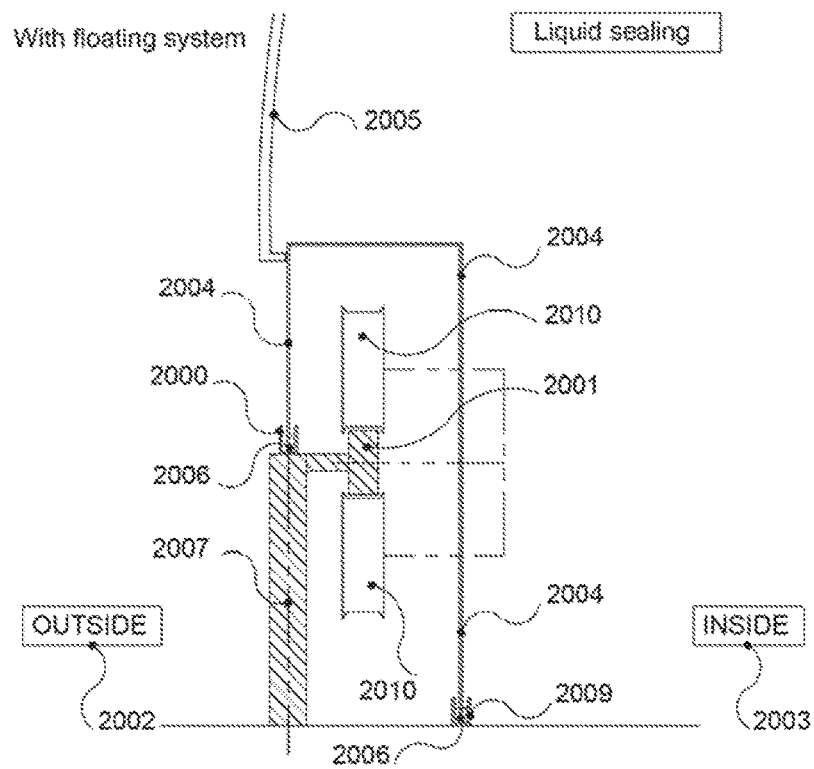
FIGS. 20A-B illustrate a liquid sealing system using a wheel system for a rotating roof, according to certain embodiments.
Figure 20B:
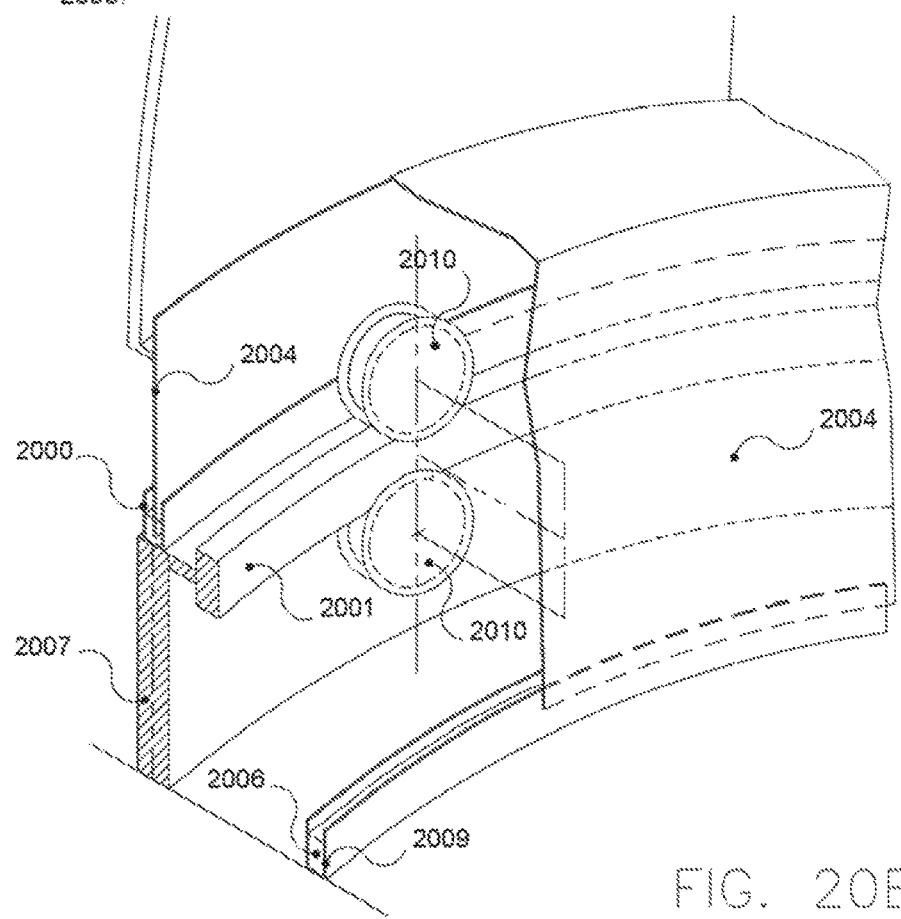

FIGS. 20A-B: With Wheel System

In this example, the rotating part uses any wheel (2010) system. The canals could be placed anywhere outside the rotation circle and inside it. In this case, if we imagine the rail is mounted on a closed wall (2007), the outer canal (2000) may sit on this wall. If we imagine the lower wheel is close to the ground, the inner canal (2009) is on the ground. This way, the whole rail+wheel mechanism is in a protected atmosphere and the building is very well insulated from the outside.

Figure 20C:
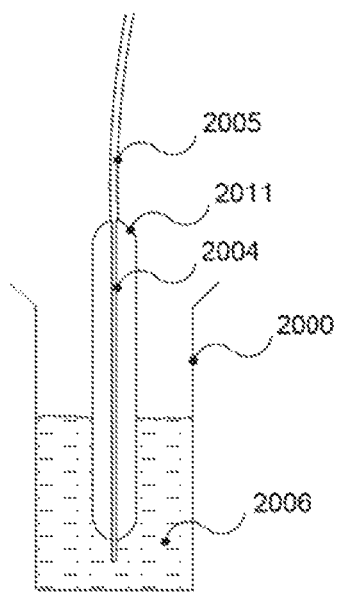
FIGS. 20C-D illustrate a liquid sealing system using a floating system for a rotating roof, according to certain embodiments.
Figure 20D:
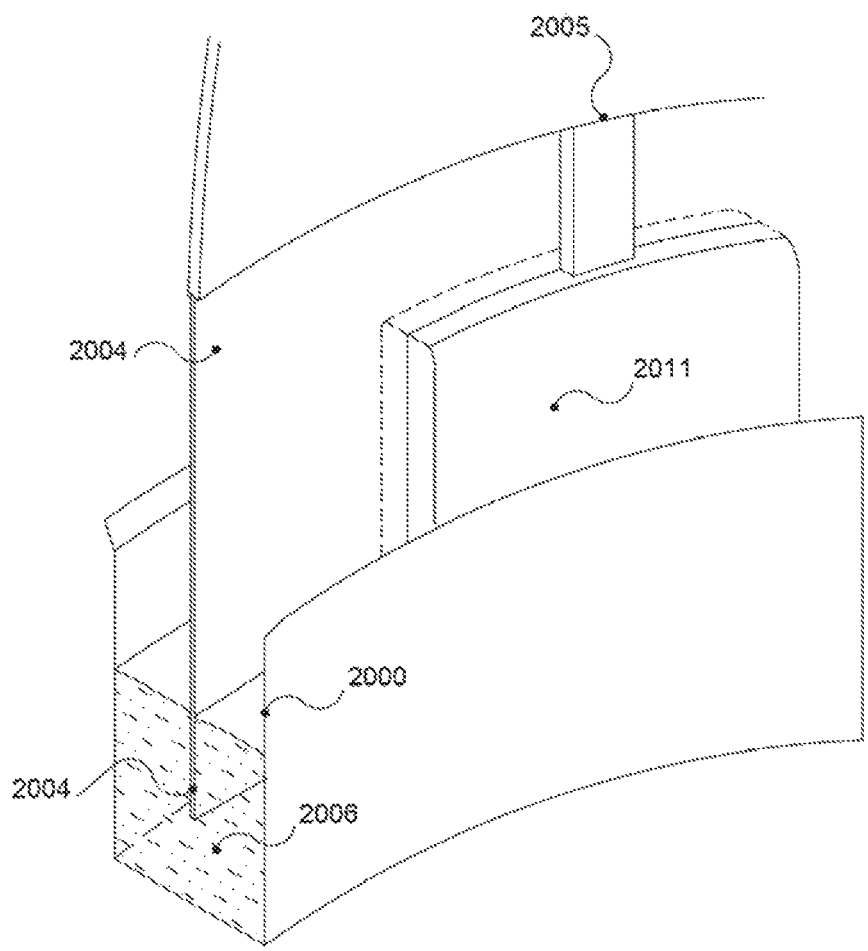

FIGS. 20C-D: With Floating System

In this example, floats (2011) moving in a circular canal (2000) ensure the rotating part's (2005) support and guidance. If the floats (2011) are extended to the whole length of the canal, like a single float all around, they provide automatically the sealing at the same time. If there are several separate floats, a skirt (2004) may achieve the sealing function. Whether or not it is connected to the floats (for example, it may be only between the floats or all around), the "skirt" (2004) is connected to the moving part (2005) and is immersed in the liquid (2006), and slides in it with the floats and the rotating part. The sealing function can be achieved using the same canal (2000) as for the floating function, but it may also be achieved using another canal, or even two more canals if an even better insulation is desired as in FIG. 20B.

Figure 20E:
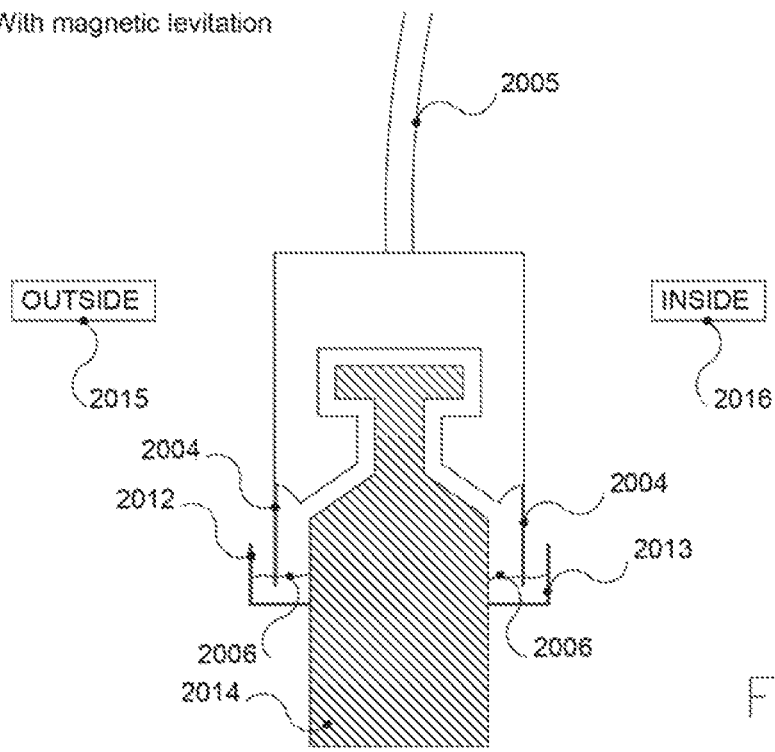
FIGS. 20E-F illustrate a liquid sealing system using a magnetic levitation for a rotating roof, according to certain embodiments.
Figure 20F:
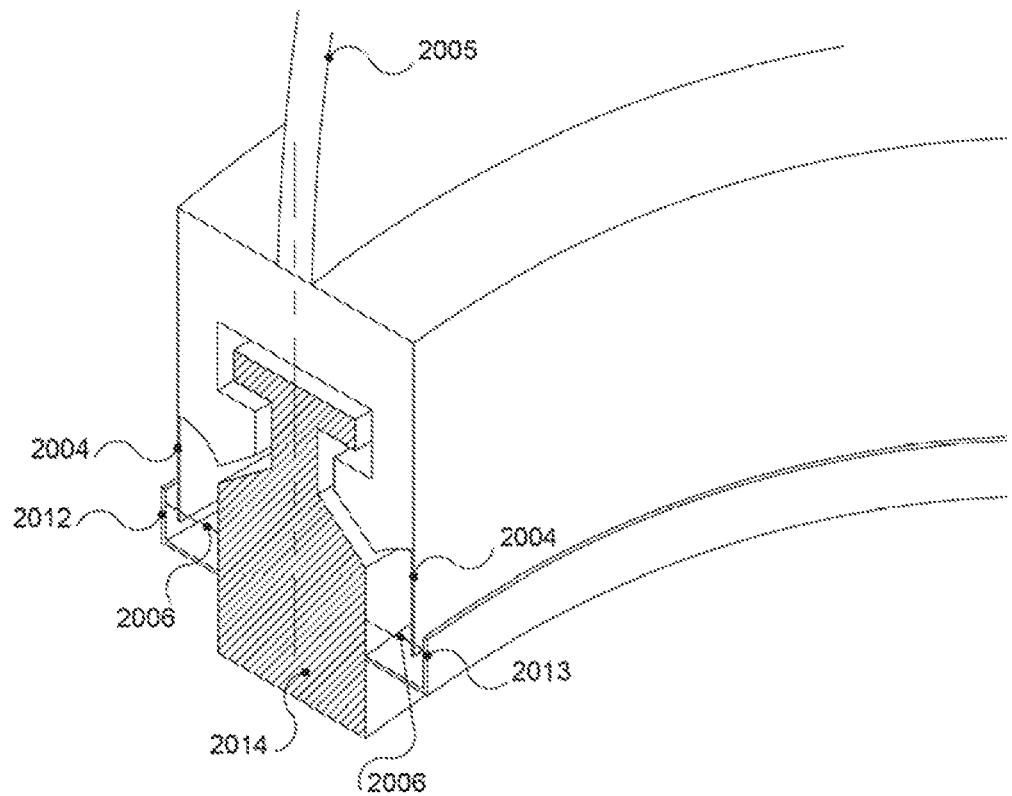

FIGS. 20E-F: With Magnetic Levitation

In this example, two sealing canals (Canal 1 (2012), and Canal 2 (2013)) are created, close to the rail (2014). One is outside (2015) the circle and the other one is inside (2016) the circle. A "skirt" (2004) rotates with the moving part (2005) and its lower edge is constantly in the liquid (2006), whatever the variation of level due to levitation. The canals may be located in various places, depending on the project's specifics.

FIGS. 21A-B

Solar greenhouse: These figures show an example of a rotating roof (2100) used to create a greenhouse.

Figure 21A:
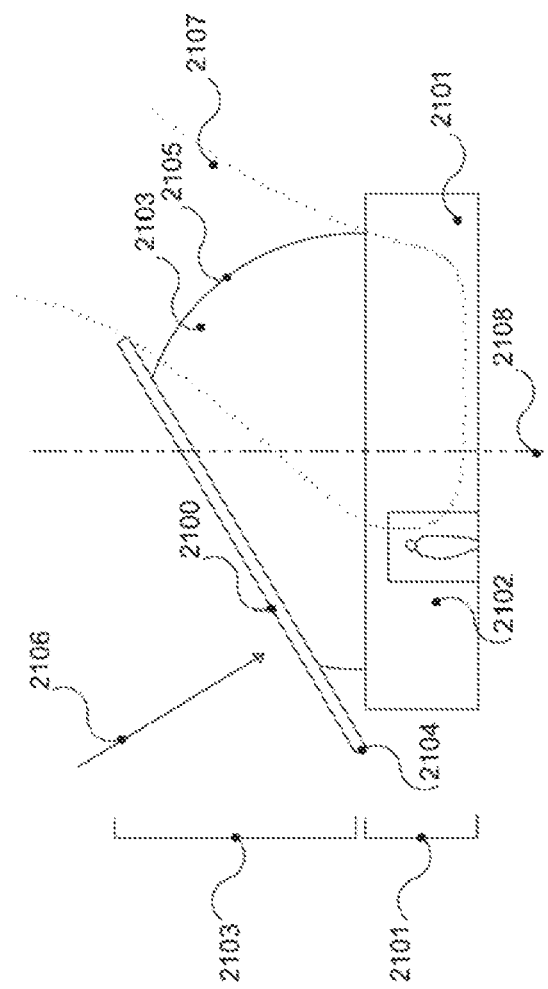
FIG. 21A illustrates a schematic section of a greenhouse rotating roof, according to certain embodiments.

FIG. 21A is a schematic section of a greenhouse with a lower fixed part (2101) (in this example, high enough for a door (2102) to fit in) and a rotating part (2103) composed of a large sloped opaque plane (2104) (it could be solar panels) and of a translucent back (2105). The opaque plane (2104) blocks the direct sun light (2106) and the translucent back skin (2105) lets a lot of indirect natural light (2107) in the building. The vertical axis of rotation (2108) is not necessarily the center of the slope plane.

Figure 21B:
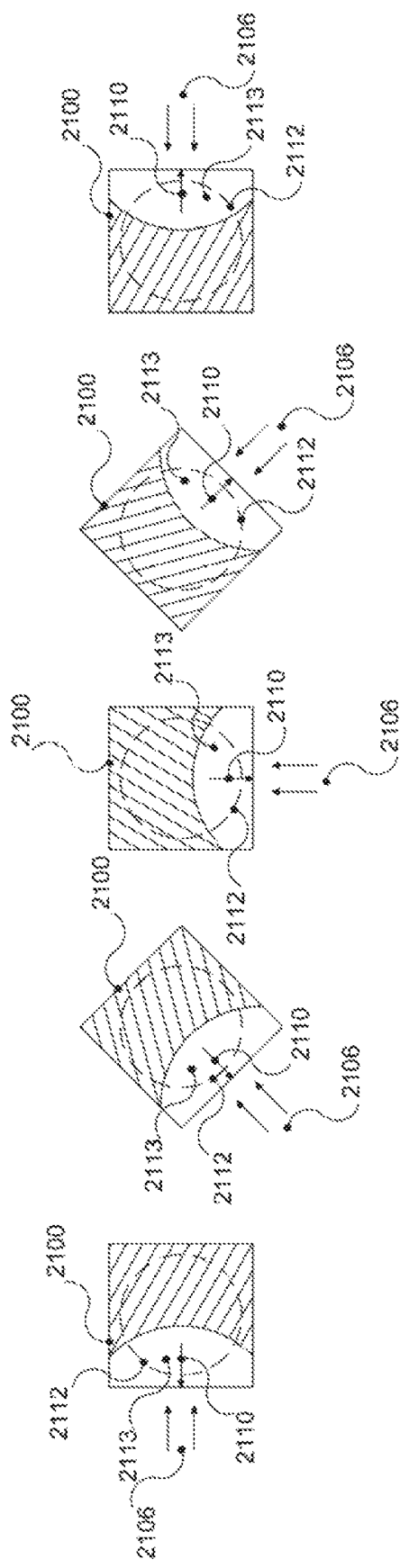
FIG. 21B illustrates a series of five drawings of a roof rotating to track the sun, according to certain embodiments.

FIG. 21B shows a series of five drawings and is an example of the roof (2100) rotating to track the sun (light (2106) in the morning on the right, noon in the middle and evening on the left). The direction of the direct sun is indicated by the parallel arrows. The opposing single arrow (2110) indicates the bottom part of the sloped roof (2100) at each time. In this example, we assume the greenhouse floor plan is limited by the circle of contact (2112). On this series of five drawings, the part of the floor that is lit by favorable indirect light is indicated by the hatched area. The non-hatched area (2113) is the darker part at each moment. This series of drawings show that most of the ground is alternatively lit at some moment of the day and most of the greenhouse is lit most of the time. This is a significant improvement over classical greenhouses.

FIGS. 22A-C

Figure 22A:
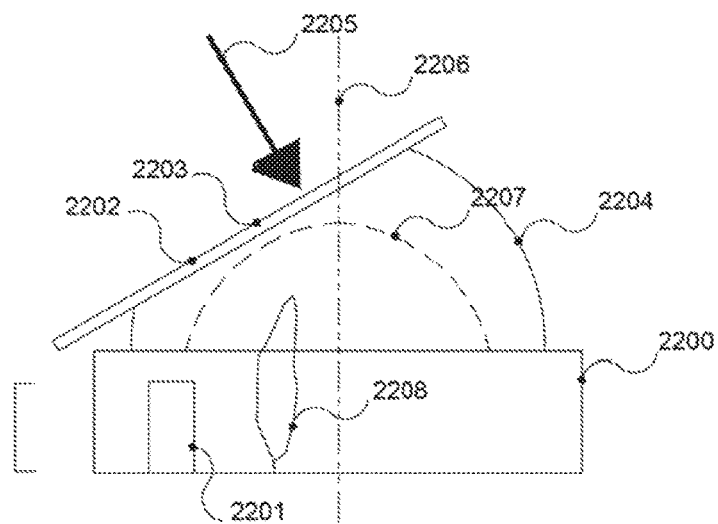
FIG. 22A illustrates a schematic section of a solar greenhouse blocking direct sunlight, according to certain embodiments.
Figure 22B:
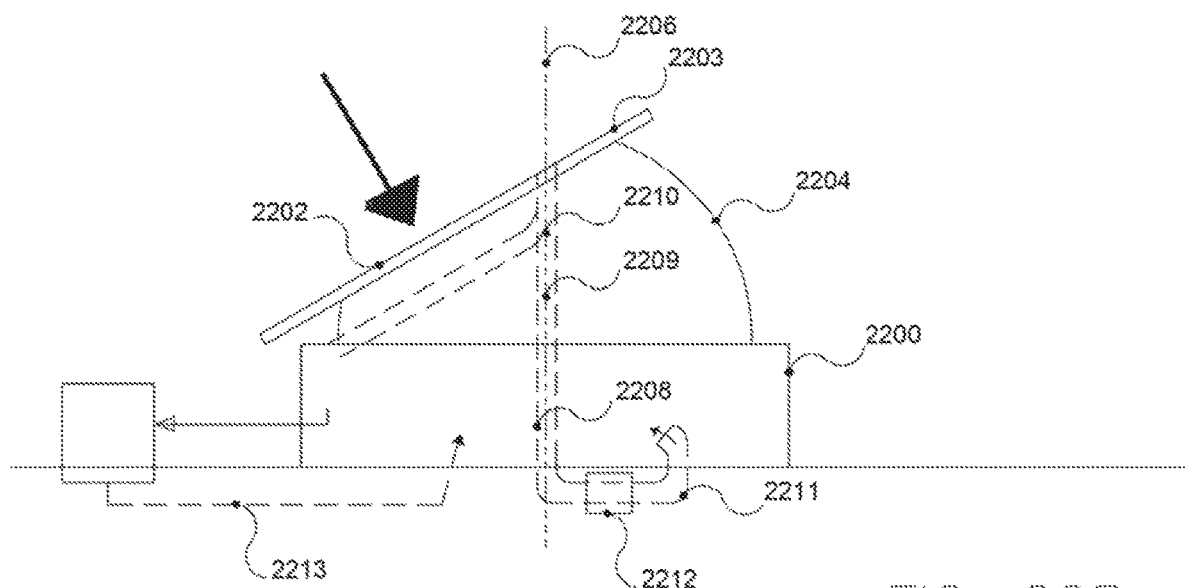
FIG. 22B illustrates advanced solar technology for extracting electricity and hot air for a rotating roof, according to certain embodiments.
Figure 22C:
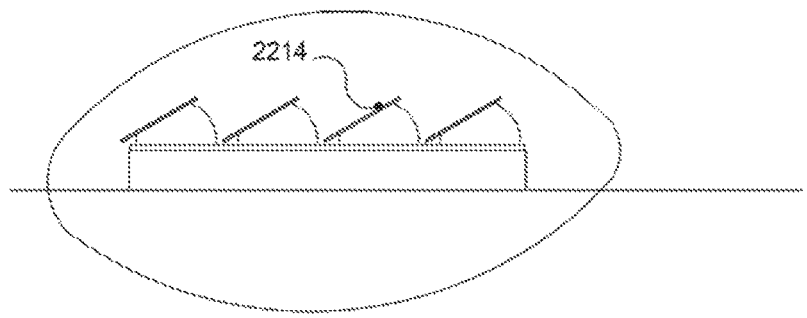
FIG. 22C illustrates for a rotating saw-tooth roof, according to certain embodiments.

FIGS. 22A-C show solar greenhouses as examples of application.

FIG. 22A is a schematic section of a greenhouse with a lower fixed part (2200) (high enough for a door (2201) to fit in/may be made of a translucent and insulating skin) and a rotating part (2202) composed of a large sloped opaque plane (2203) (it could be solar panels) and of a translucent skin (2204) in the back. The opaque plane (2203) blocks the direct sun light (2205) and the translucent back skin (2204) lets a lot of indirect natural light in the building. The vertical axis of rotation (2206) is not necessarily the center of the sloped plane (2203).

In the center of the space of the green house, a large area (2207) accepts high plants (2208) due to the geometry's rotation. The darker spaces can be used for circulation, storage, engineering components, etc.

FIG. 22B uses the same scheme to show an example of a solar energy greenhouse. The sloped rotating plane (2203) may use an advanced solar technology and extract electricity and hot air from the sun. This hot air and the electrical wires may be connected to the fixed part's energy network (2208) through an axial exhaust (2209) and electrical connector. The hot air (2210) can be used directly to heat the building or be processed through the building's heating/cooling system (2211), optionally via a heat converter or exchanger (2212). This agriculturally efficient greenhouse can then power itself, or the community or for example use the power for water desalinization and provide fresh water (2213) for agricultural use.

FIG. 22C is a reminder that other architectural forms are possible for use as a greenhouse, such as a rotating saw tooth roof (2214).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

The invention claimed is:

1. A solar panel system, comprising:
a base having a base shape, the base configured to be attached to a building structure, the building structure being at a geographic location on the Earth, the Earth having an Earth surface at the geographic location, the Earth surface at the geographic location having a horizontal plane;
a rotating crown having a rotating mechanism, a center of rotation and a crown shape, the base configured to support the rotating crown;
a solar collecting device having a solar collecting device shape, the solar collecting device configured to be attached to the rotating crown, the solar collecting device having an exposed solar collecting surface, the base shape, the crown shape and the solar collecting device shape configured to position the exposed solar collecting surface in a sloped orientation relative to the horizontal plane of the Earth surface at the geographic location, the rotating mechanism being configured to rotate the solar collecting device, the base shape and the crown shape being configured to position the rotating mechanism so that the rotating mechanism rotates about an axis that is substantially perpendicular to the horizontal plane of the Earth surface at the geographic location and so that the exposed solar collecting surface is capable of maintaining a substantially consistent slope relative to the horizontal plane of the Earth surface at the geographic location as the exposed solar collecting surface rotates;
a control system configured to control the rotating mechanism to rotate, the control system capable of rotating the rotating mechanism to direct the exposed solar collecting surface from a first azimuthal direction at a first time to a second azimuthal direction at a second time, the Sun transitioning from a first sky position at the first time to a second sky position at the second time, the first azimuthal direction facing the exposed solar collecting surface towards the Sun more directly than the second azimuthal direction at the first time while the Sun is at the first sky position, the second azimuthal direction facing the exposed solar collecting surface towards the Sun more directly than the first azimuthal direction at the second time while the Sun is at the second sky position; and
a wire or pipe coupled to the solar collecting device substantially at the center of rotation and configured to transfer solar energy captured by the solar collecting device.

2. The solar panel system of claim 1, wherein the rotating crown includes a roof of a building.

3. The solar panel system of claim 1, wherein the rotating crown includes at least a portion of a greenhouse.

4. The solar panel system of claim 1, wherein the rotating mechanism includes a magnetic linear motor for power.

5. The solar panel system of claim 1, wherein the rotating mechanism includes rolling wheels.

6. The solar panel system of claim 1, wherein the base includes a liquid for supporting the rotating crown.

7. The solar panel system of claim 1, wherein the base includes a mechanism for generating magnetic levitation to support the rotating crown.

8. The solar panel system of claim 1, wherein the base includes a liquid system, the liquid system including a fixed circular canal having a same center as the center of rotation of the rotating crown, the fixed circular canal being filled with a liquid and having a circular skirt attached to the rotating mechanism, the circular skirt moving in the liquid in the canal.

9. The solar panel system of claim 1, further comprising an anti-lift system.

10. The solar panel system of claim 1, further comprising a mechanism for preventing the rotating crown from drifting away from a path of the rotating crown.

\* \* \* \* \*